United States Patent [19]
Wang

[11] Patent Number: 5,500,808
[45] Date of Patent: Mar. 19, 1996

[54] APPARATUS AND METHOD FOR ESTIMATING TIME DELAYS USING UNMAPPED COMBINATIONAL LOGIC NETWORKS

[75] Inventor: Albert R. Wang, Fremont, Calif.

[73] Assignee: Synopsys, Inc., Mountain View, Calif.

[21] Appl. No.: 409,627

[22] Filed: Mar. 23, 1995

Related U.S. Application Data

[63] Continuation of Ser. No. 645,903, Jan. 24, 1991, abandoned.

[51] Int. Cl.⁶ .................................................. G06F 17/50
[52] U.S. Cl. ............................................ 364/578; 364/488
[58] Field of Search ................................. 364/488, 489, 364/490, 578; 395/500

[56] References Cited

U.S. PATENT DOCUMENTS

| | | | |
|---|---|---|---|
| 4,527,249 | 7/1985 | Van Brunt | 364/578 |
| 4,584,642 | 4/1986 | Fudanuki | 395/500 |
| 4,594,677 | 6/1986 | Barlow | 364/578 |
| 4,656,580 | 4/1987 | Hitchcock, Sr. et al. | 395/500 |
| 4,703,435 | 10/1987 | Darringer et al. | 364/489 |
| 4,725,975 | 1/1988 | Sasaki | 364/491 |
| 4,751,637 | 7/1988 | Catlin | 395/500 |
| 4,769,817 | 9/1988 | Krohn et al. | 371/23 |
| 4,787,061 | 11/1988 | Nei et al. | 395/500 |
| 4,916,627 | 4/1990 | Hathaway | 364/490 |
| 4,924,430 | 5/1990 | Zasio et al. | 364/578 |
| 4,962,341 | 10/1990 | Schoeff | 307/200.1 |
| 5,084,824 | 1/1992 | Lam et al. | 364/490 |
| 5,091,872 | 2/1992 | Agrawal | 364/578 |
| 5,157,620 | 10/1992 | Shaar | 364/578 |
| 5,245,549 | 9/1993 | Shoji et al. | 364/489 |
| 5,345,393 | 9/1994 | Ueda | 364/489 |

Primary Examiner—Vincent N. Trans
Attorney, Agent, or Firm—Skjerven, Morrill, MacPherson, Franklin & Friel

[57] ABSTRACT

A new method and structure are provided for simulating the time delay associated with signal propagation through a mapped and optimized logic network for a selected target technology using only information from an unmapped logic network. For each target technology, the method and structure include the time delay characteristics of the mapping and optimization strategies used to generate an optimized network using the library of standard gates for that target technology. The functional complexity of each unmapped logic node and the complexity of the fanout for each unmapped logic node are also included in the simulated time delay.

21 Claims, 23 Drawing Sheets

Microfiche Appendix Included
(1 Microfiche, 22 Pages)

APPARATUS AND METHOD FOR ESTIMATING TIME DELAYS USING UNMAPPED COMBINATIONAL LOGIC NETWORKS

This application is a continuation of application Ser. No. 07/645,903, filed Jan. 24, 1991, now abandoned.

CROSS REFERENCE TO MICROFICHE APPENDIX

Appendix A, which is a part of the present disclosure, is a microfiche appendix consisting of 1 sheet of microfiche having a total of 22 frames. Microfiche Appendix A is a listing of computer programs and related data for one embodiment of this invention, which is described more completely below.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates generally to combinational and sequential logic networks and in particular to a method and means for predicting timing information for a mapped and optimized logic network using the unmapped logic network.

2. Prior Art

Typically, an automatic design system is used to convert a logic design into a specific logic circuit for an application specific integrated circuit (ASIC). However, prior to using the automated design system, a particular fabrication technology, sometimes referred to as the target technology, is selected for the ASIC. Usually, an ASIC manufacturer has a number of fabrication lines. Each fabrication line is a possible target technology. For example, a 2.0 micron complementary metal oxide semiconductor (CMOS) fabrication line may be a first target technology and a 0.5 micron CMOS fabrication line a second target technology. Other examples of target technologies include bipolar emitter coupled logic (ECL) fabrication lines and bipolar transistor-transistor logic (TTL) fabrication lines. For each fabrication line, the manufacturer typically provides a library of standard gates, also called gates, that must be used to implement the ASIC logic design for that particular fabrication line. Thus, selection of the fabrication line defines the library of standard gates that must be used to implement all user logic designs for that target technology.

Typically, an automated design system first converts Boolean logic equations or a description of a logic circuit in a hardware description language to an unmapped logic network, sometimes referred to herein as an unmapped logic circuit. In general terms, an unmapped logic network is a directed acyclic graph where (i) each node in the graph represents a signal in the circuit and has a logic function and (ii) each edge in the graph represents the direct signal dependencies. Moreover, the unmapped logic network is independent of any fabrication process. Specifically, the logic functions of the directed acyclic graph nodes are not specified in terms of the gates associated with a particular fabrication process.

A mapping and optimization means is used to convert the unmapped logic network to a mapped and optimized logic network consisting of interconnections of standard gates selected from the target technology library. The mapping and optimization means is typically chosen by the user.

In addition to the standard gates, most target technology libraries include information about the signal propagation delay, i.e., the time required for a signal change on a gate input line to travel through the gate to the gate output line. These time delays may be used to determine the time delay characteristics of the mapped logic network. Generally, the longer the signal propagation time through the logic network, i.e., the longer the delay time, the poorer the speed performance of the logic network and conversely.

The time delay of the mapped and optimized logic network is typically one of the performance parameters for the ASIC design. Other performance parameters include the size and the power consumption of the mapped and optimized logic network. Usually, the criteria used by the mapping and optimization means are a combination of these parameters, e.g., a minimum area circuit with a maximum time delay of ten nanoseconds (ns) and a power consumption of no more than one milliwatt.

For most user logic designs, speed optimization is a repetitive process that includes many changes to the logic network. Mapping the logic network after each change and using the target technology library time delay information to determine the time delay for the mapped logic network, while accurate, is not feasible in practice from a computer time standpoint.

The logic circuit speed optimization process can be significantly enhanced if the user has means to determine speed critical sections of the unmapped logic network, and uses these means to direct the optimization without iteratively mapping each change to determine the effect of the change on speed performance. Thus, different methods have been used to estimate the time delay associated with a mapped logic network using only the unmapped logic network. Unfortunately, the prior art methods for estimating mapped logic network time delays using an unmapped logic network have not been particularly successful.

For example, one of the most commonly used methods to estimate the mapped logic network time delay is to count the number of logic levels in the unmapped logic network. To determine the logic levels, a signal path is selected through the unmapped logic network. Each logic node in the signal path is a logic level. A logic node is sometimes a logic gate, buffer, and invertor and other times only each logic gate is considered a logic node.

A single constant time delay is assigned to every logic node in the signal path independent of the either the logic complexity of the logic node or the number of other logic nodes directly driven by that logic node. Therefore, the estimated time delay is a function of only the number of logic nodes. The only good feature of this model, referred to as the level model, is its simplicity. The level model fails to account for either the complexity of the logic function of the node or the number and complexity of other nodes driven by the node. The level model also fails to consider the effect of either the target technology or the mapping and optimization method on the mapped logic network time delay.

Various improvements to the level model have been attempted. In one improvement, referred to as the level-fanout model, a function of the fanout at a logic node is added to the constant time delay of the level model. Typically, the function is a linear function of the fanout at the logic node. As used herein, fanout is the number of input lines driven by the signal on the output line of a logic node.

In general, the methods used to estimate time delay using unmapped logic networks have several shortcomings. First, the methods fail to account for the complexity at a given logic node. Second, the methods fail to account for the fanout capacitance at a logic node. The level-fanout method attempts to capture some fanout information, but this method evaluates neither the slope of the linear function nor the relative importance of the slope to the constant time delay. Third, the actual time delay for a mapped logic network is dependent upon the characteristics of the mapping and optimization method. Fourth, the methods fail to account for the target technology. The actual time delay parameters for a mapped logic network vary greatly from target technology to target technology. Fifth and finally, since these methods fail to account for either the mapping and optimization method or the target technology, the time delays are at best relative measures, which can only be used for comparisons with each other and have no meaningful absolute value for the time delay. As used herein, "absolute value" for the time delay means an approximation of the actual delay time associated with the mapped and optimized logic network in the target technology as opposed to a "relative value" measure.

Thus, a method for generating accurate time delay estimates after mapping for a specified target technology must account for (i) the actual time delays in the mapped logic network that depend on the choice of target technology and (ii) the actual time delays that depend on the chosen mapping and optimization method. If the method does not account for these time delays, the method cannot be used to obtain absolute time delay values. A method for estimating mapped logic network time delays that included both target technology time delay characteristics and mapping and optimization time delay characteristics would represent a significant new tool for computer aided logic design.

SUMMARY OF THE INVENTION

According to the principles of this invention, a new method is provided for simulating the time delay associated with signal propagation through a mapped and optimized logic network for a selected target technology using only information from an unmapped logic network. For each target technology, the novel method includes the time delay characteristics of the mapping and optimization strategies used to generate the optimized network from a library of standard gates for the target technology. Therefore, the method includes the time delay characteristics of both the target technology and the mapping and optimization method.

In addition, the method of this invention generates a time delay simulator for the mapped and optimized logic network in the target technology based upon the unmapped logical network. Unlike the prior art time delay estimators described above, time delays generated by the time delay simulator of this invention are meaningful absolute values. Thus, the time delay simulator provides a means for performing scoping studies using only the unmapped logical network.

According to the principles of this invention, the method and simulator accurately and completely consider (a) the functional complexity and (b) the complexity of the fanout of logic nodes in the unmapped logic network. In the method of this invention, user selected logic nodes in an unmapped logic network are sequentially processed. The first step of the method simulates the time delay in the mapped and optimized logic network associated with the fanin of a logic node in the unmapped logic network. The second step simulates the time delay of the mapped and optimized logic network associated with the fanout of the logic node in the unmapped logic network. The third step combines the time delays generated in the first two steps and scales the result to obtain an absolute value of the time delay for the logic node in the unmapped logic network. The fourth step adds the absolute value of the time delay from the third step to the accumulated time delay for the unmapped nodes previously processed. When all the user selected unmapped logic nodes are processed, the accumulated value from the fourth step is the simulated time delay for the unmapped logic network for a predetermined mapping and optimization method and a predetermined target technology.

In one embodiment of this method, three absolute value time delay components are generated in the third step in addition to the total time delay. A first component is the absolute value of the time delay in the mapped and optimized logic network associated with the fanin of the unmapped logic nodes. The second component is the absolute value of the time delay in the mapped and optimized logic network associated with the fanout of the unmapped logic nodes. The third component is the intrinsic time delay of the logic nodes in the mapped and optimized logic node associated with the unmapped logic nodes. Hence, the method of this invention simulates (i) the absolute value of the total time delay and (ii) each of the components that make-up the total time delay.

Unlike the prior art methods described above that, at best, provided only relative values of the time delay, this method provides a means for ascertaining the actual speed of the mapped and optimized logic network for the target technology using only an unmapped logic network. In addition to the absolute values of the time delay, the delay times are obtained without actually performing the mapping and optimization and subsequently using the delay model usually provided with the target technology library ("target library"). Therefore, the expense of initial scoping studies and similar optimization studies is greatly reduced both in the engineer time and the computer resources required.

An absolute value delay time simulator for a logic network generated using a predetermined mapping and optimization method and a predetermined target technology includes means for performing each of the steps in method, described above. Specifically, a means for simulating fanin time delay generates a measure of the time delay of the mapped and optimized logic network using the fanin of a logic node in a user specified unmapped logic network. In parallel, in this embodiment, a means for simulating fanout time delay generates a measure of the time delay of the mapped and optimized logic network using the fanout of the logic node in the unmapped logic network. A means for generating absolute time values, in response to the signals from the fanin and fanout simulating means combines and scales the signals to obtain an absolute value of the time delay in the mapped and optimized logic network that is associated with the unmapped logic node being processed.

The absolute value time generator, in one embodiment, provides three absolute value time delay components. A first component is the absolute value of the time delay in the mapped and optimized logic network associated with the fanin of the unmapped logic nodes. The second component is the absolute value of the time delay in the mapped and optimized logic network associated with the fanout of the unmapped logic nodes. The third component is the intrinsic time delay of the logic nodes in the mapped and optimized logic node associated with the unmapped logic node. Hence, absolute value time generator generates (i) a signal representing the absolute value of the total time delay and (ii) three signals representing each of the components that make-up the time delay.

Finally, an accumulator means, in response to the output signal or signals from the generator means, accumulates the time delay signals for each unmapped logic node processed. Upon processing of all the unmapped logic nodes, the output signal of the accumulator means is a simulation of the time delay of the mapped and optimized logic network in the target technology.

A process for generating a time delay simulator for a mapped and optimized logic network that uses a characteristic of a logic node in an unmapped logic network to produce the delay time is another of the novel features of this invention. In this process, a target technology having a library of standard gates and a mapping and optimization method are selected. Following selection of the target technology, a representative logic function is selected. The representative logic function is used to capture the functional complexity of an unmapped logic node as well as the complexity of the fanout for that logic node. Also, any logic network can be represented by using only the representative logic function.

Next, a multiplicity of sample logic networks having a selected range of the characteristic, typically either fanin or fanout, are selected. The sample logic networks are formed using only the representative logic function. Each of the multiplicity of sample logic networks are mapped and optimized for speed using the library of standard gates with the chosen mapping and optimization method thereby producing a multiplicity of mapped and optimized sample logic networks.

Subsequently, the delay time for each of the multiplicity of mapped and optimized sample logic networks is ascertained thereby generating data including for each value of the characteristic of the unmapped logic network, the associated delay time in the mapped and optimized sample logic network. Finally, the data is used to produce a time delay simulator for a mapped and optimized logic network that captures a change in the delay time in the mapped and optimized logic network in the target technology with a change in the value of the characteristic of a logic node in an unmapped logic network. This method captures both the functional and fanout complexity of the unmapped logic nodes and accurately determines the delay time associated with that complexity.

DETAILED DESCRIPTION

Figure 1A:
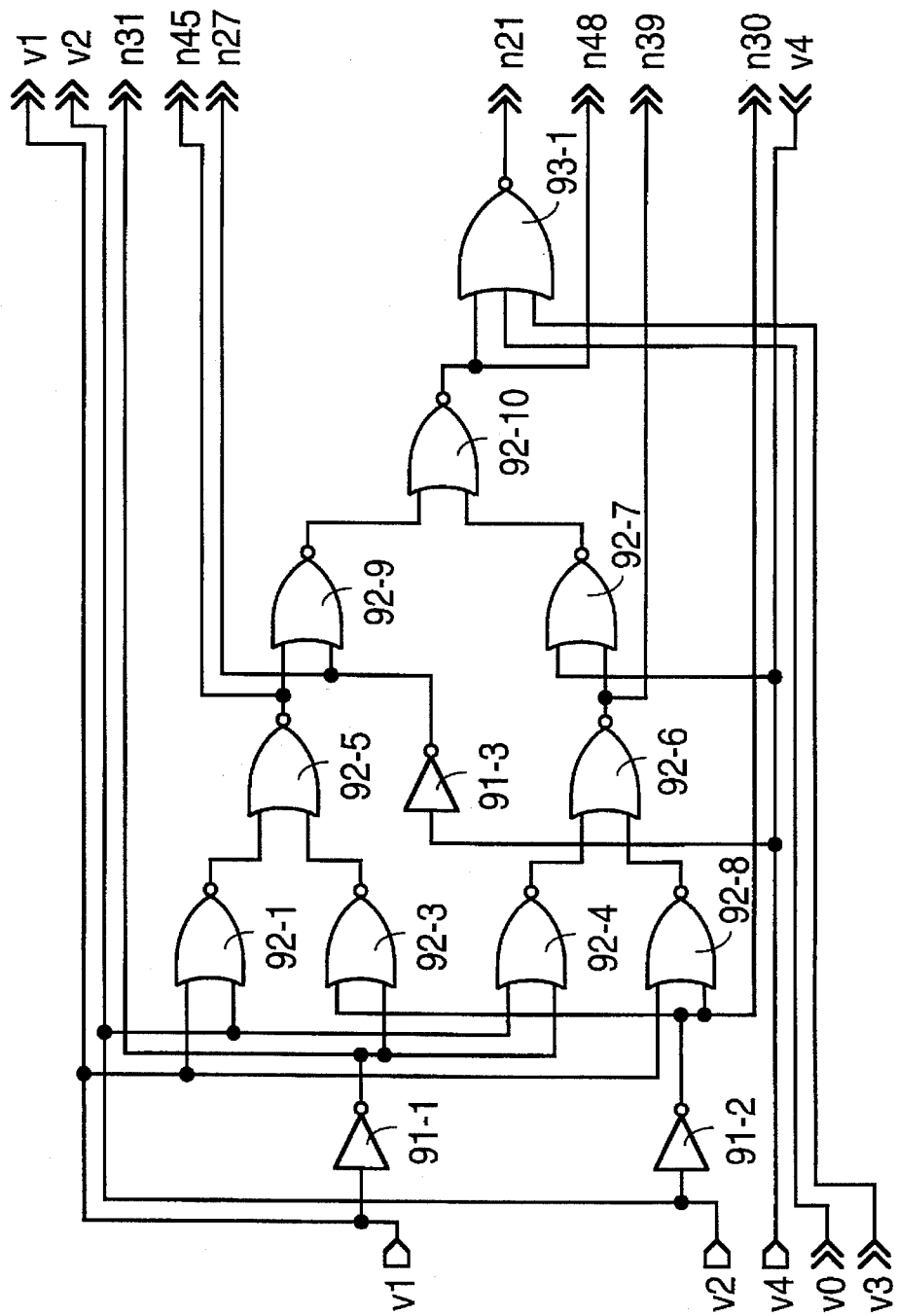
FIGS. 1(A), 1(B), 1(C), 1(D), and 1(E) illustrate a prior art unmapped logic network having a multiplicity of logic nodes with different fanins and fanouts.
Figure 1B:
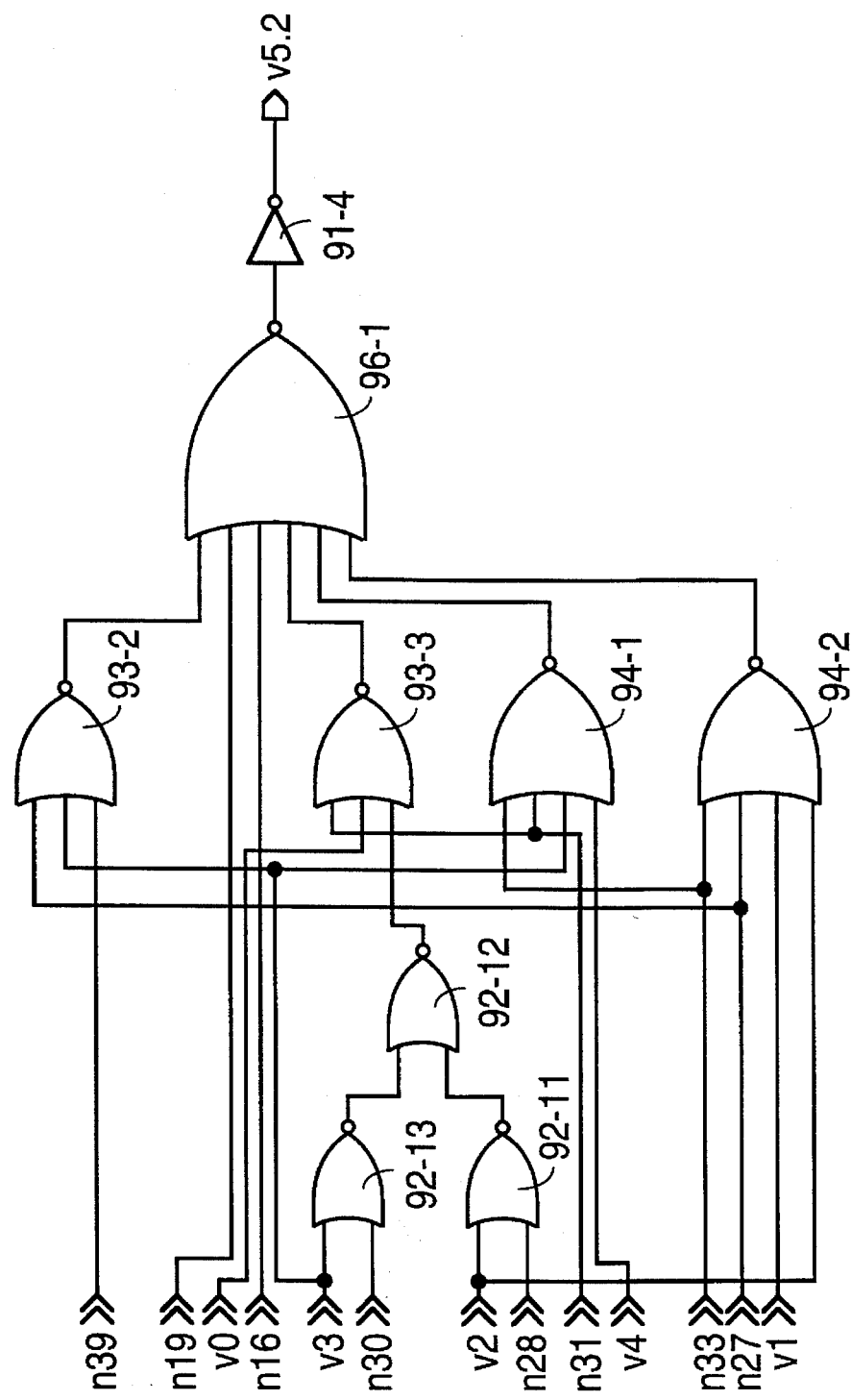
Figure 1C:
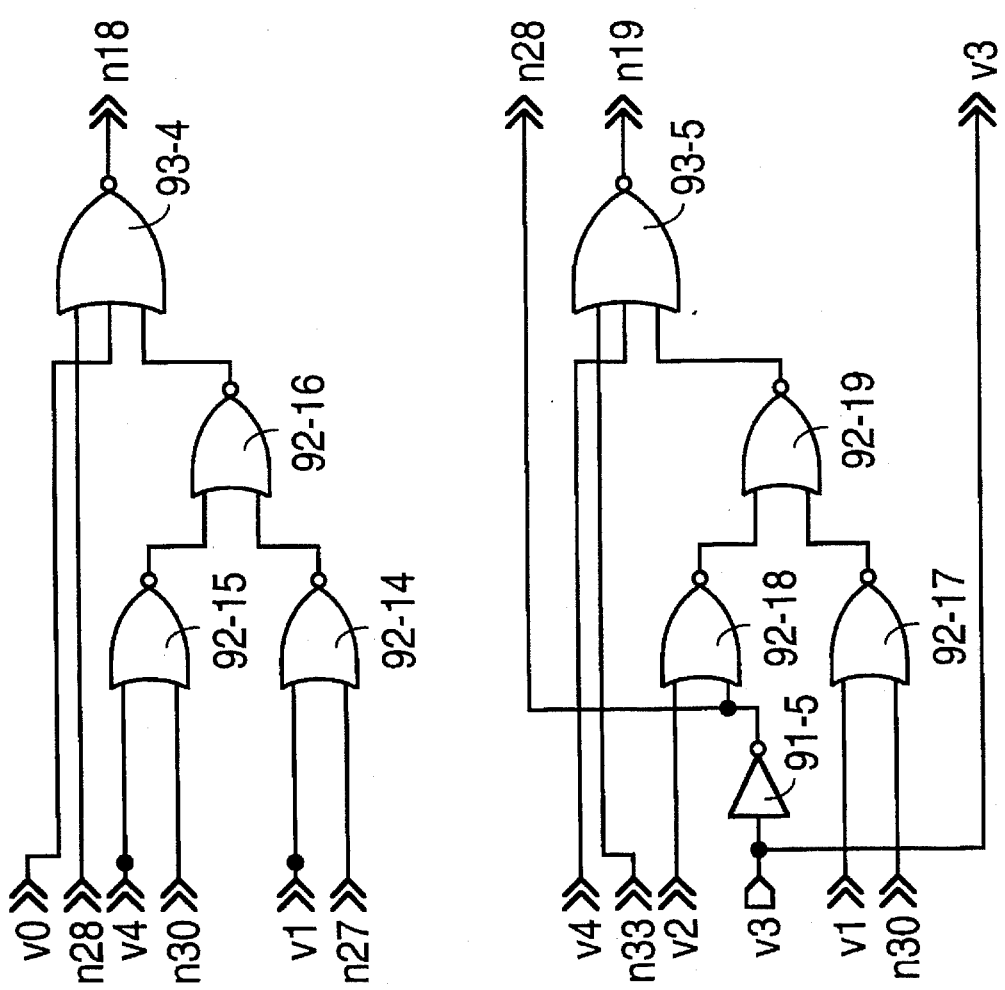
Figure 1D:
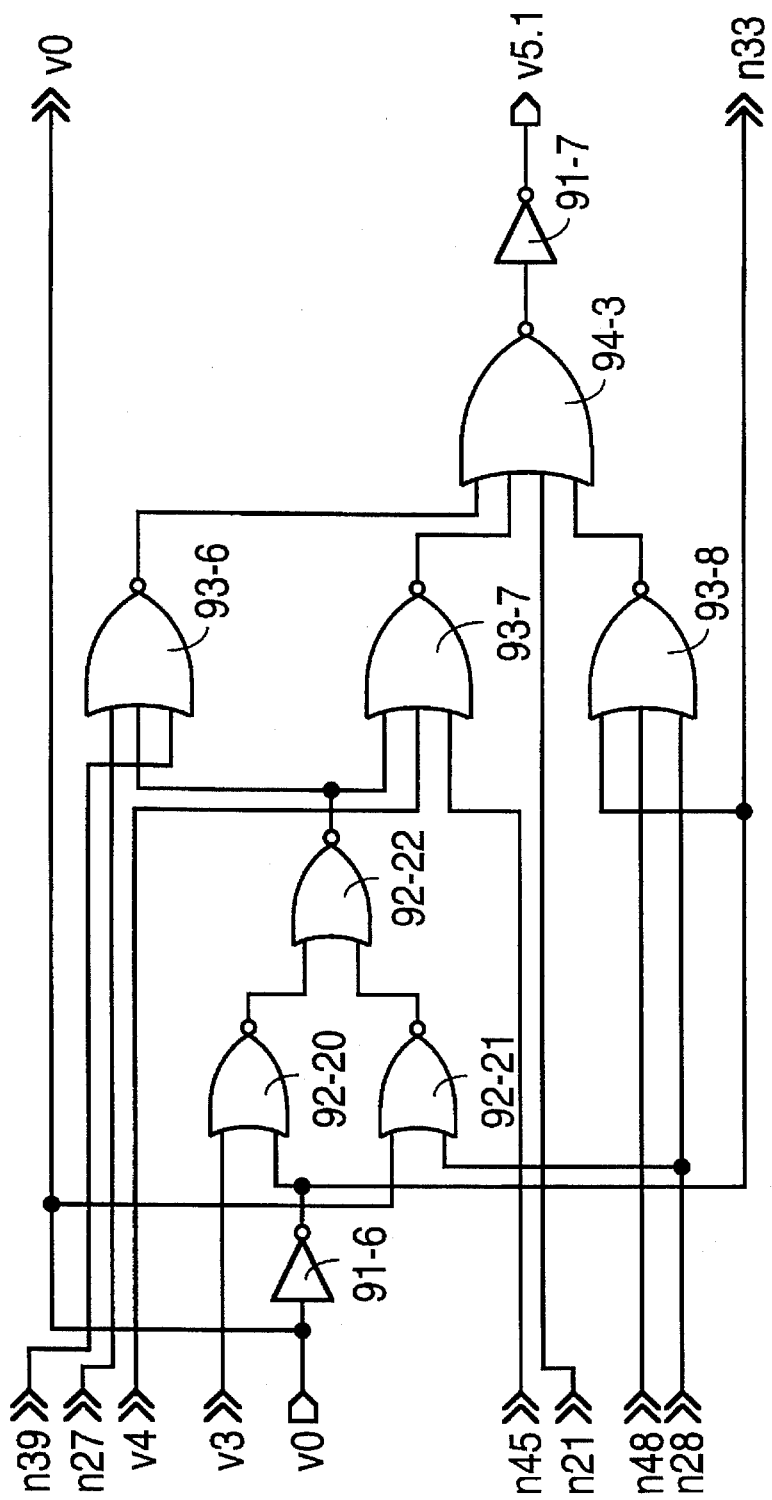
Figure 1E:
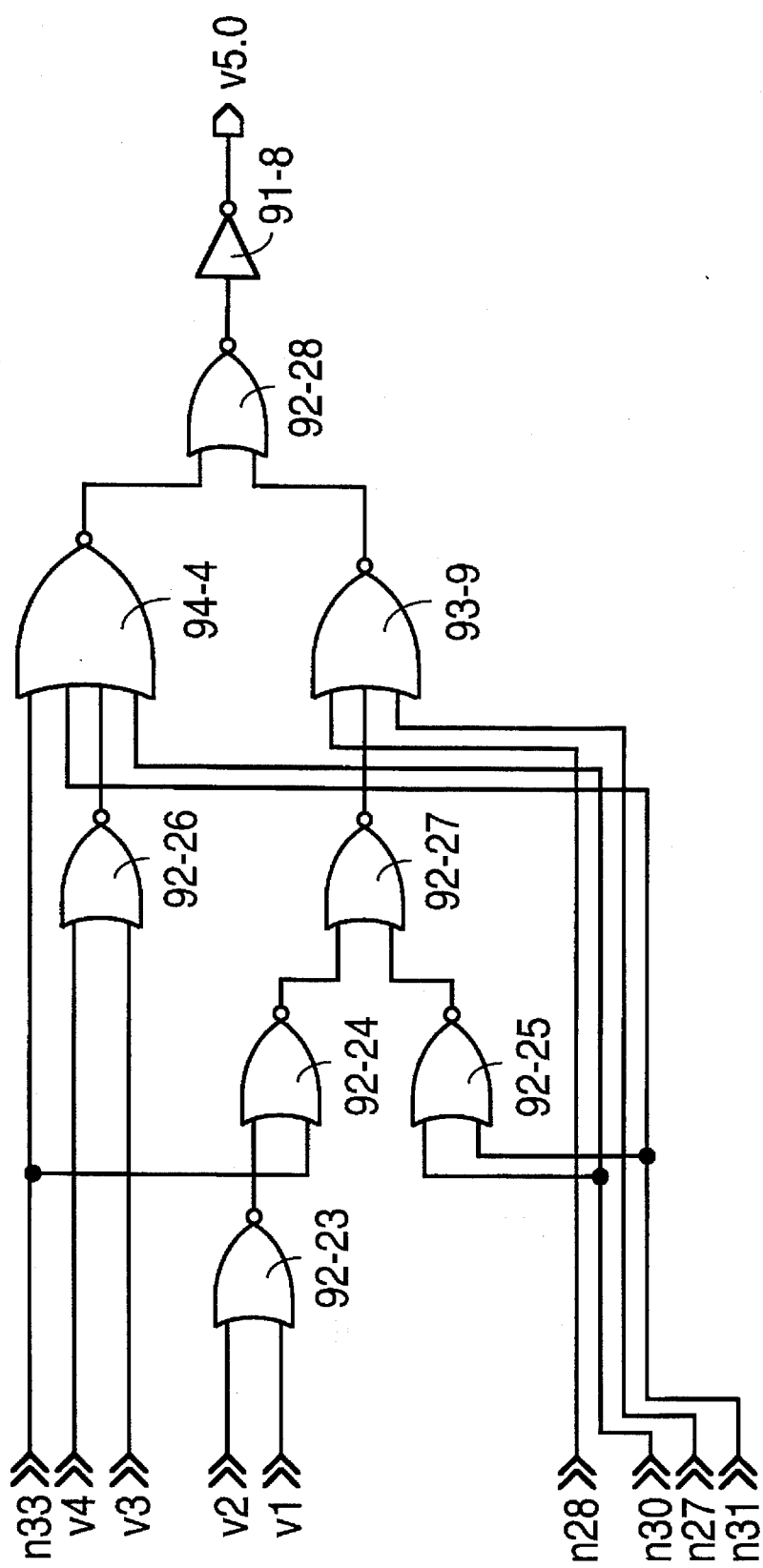

According to the principles of this invention, a new method is provided for simulating the time delay associated with signal propagation through a mapped and optimized logic network for a selected target technology using only information from an unmapped logic network. For each target technology, the novel method includes the time delay characteristics of the mapping and optimization strategies used to generate the optimized network from a library of standard gates for the target technology. Therefore, the method includes the time delay characteristics of both the target technology and the mapping and optimization method.

According to the principles of this invention, the method accurately and completely considers the functional complexity of each logic node and the complexity of the fanout for each logic node. As used herein, fanout is equivalently defined in terms of either the number of logic node input lines driven by a logic node output line or logic node input signals driven by a logic node output signals. Similarly, fanin is equivalently defined in terms of either logic node input lines or input signals to the logic node.

In the methods and structures of this invention, the simulated fanin and fanout time delays accurately reflect the actual time delays associated with the target technology and the chosen mapping and optimization method. In addition, the intrinsic time delays associated with logic nodes in the target technology are captured. The result of this method is a computer-based simulator, that is typically maintained in the dynamic random access memory of the computer, for accurately generating the absolute value of signal propagation delay times through a mapped and optimized logic network in a specified technology using only information from an unmapped logic network.

Typically, an unmapped logic network 90 (FIGS. 1A–1E.) is a set of interconnected unmapped logic nodes. In the following description, the term "logic node" refers to any one of the logic components in the group consisting of a logic gate, an invertor and a buffer. Method 100 (FIG. 2) of this invention, for a given target technology and mapping and optimization method, includes four basic steps that sequentially process each of the unmapped logic nodes in logic network 90, or alternatively specific user selected logic nodes in the logic network. (The representation of an unmapped logic network as a set of unmapped logic nodes is well known to those skilled in the art because such a representation is a normal part of mapping the unmapped logic network.)

Step 110 of method 100 simulates the time delay in the mapped and optimized logic network using the fanin for a logical node in the unmapped logic network. Step 120 simulates the time delay of the mapped and optimized logic network using the fanout for a logical node in the unmapped logic network. Step 130 combines the time delay from steps 110 and 120 and scales the combined value to obtain an absolute value of the time delay for the logic node in the unmapped logic network. Step 140 accumulates the time delays obtained from the first three steps for each logic node to obtain the simulated time delay for the mapped and optimized logic network based upon the logic nodes in the unmapped logic network that have been processed. Alternatively, in one embodiment, steps 130 and 140 are incorporated into a single step. Additional node check 150 returns processing to unmapped logic nodes 90 if any nodes remain to be processed. If all the unmapped nodes have been processed, the output signal from accumulate delay 140 is the simulated time delay for mapped and optimized logic network 175 in the target technology.

In one embodiment of method 100, three absolute value time delay components are generated, as described more completely below, in step 130 in addition to the total time delay. A first component is the absolute value of the time delay in the mapped and optimized logic network associated with the fanin of the unmapped logic node. The second component is the absolute value of the time delay in the mapped and optimized logic network associated with the fanout of the unmapped logic node. The third component is the intrinsic time delay of the logic nodes in the mapped and optimized logic network associated with the unmapped logic node. Hence, step 130, in the embodiment, provides (i) the absolute value of the total time delay and (ii) each of the components that make-up the total time delay for the unmapped logic node.

In another embodiment, step 130 is eliminated from the method, and step 140 accumulates the time delays from steps 110 and 120. In this embodiment, accumulator 140 generates the three components of the time delay so that accumulator 140 provides the total time delay, the fanin, fanout and intrinsic time delays. After all the unmapped logic nodes are processed, the output signals from accumulator 140 are scaled to obtain the simulated time delay for mapped and optimized logic network 175 in the target technology.

Using method 100 of this invention, meaningful absolute values of the time delays are obtained. Thus, unlike the prior art delay time estimators described above that, at best, provided only relative values of the time delay, this method provides a means for ascertaining the actual speed of the mapped and optimized logic network for the target technology using only an unmapped logic network. In addition to the absolute values of the time delay, the delay times are obtained without actually performing the mapping and optimization and subsequently using the delay model usually provided with the target technology library ("target library"). Therefore, the expense of initial scoping studies and similar optimization studies is greatly reduced both in the engineer time and the computer resources required.

Figure 2:
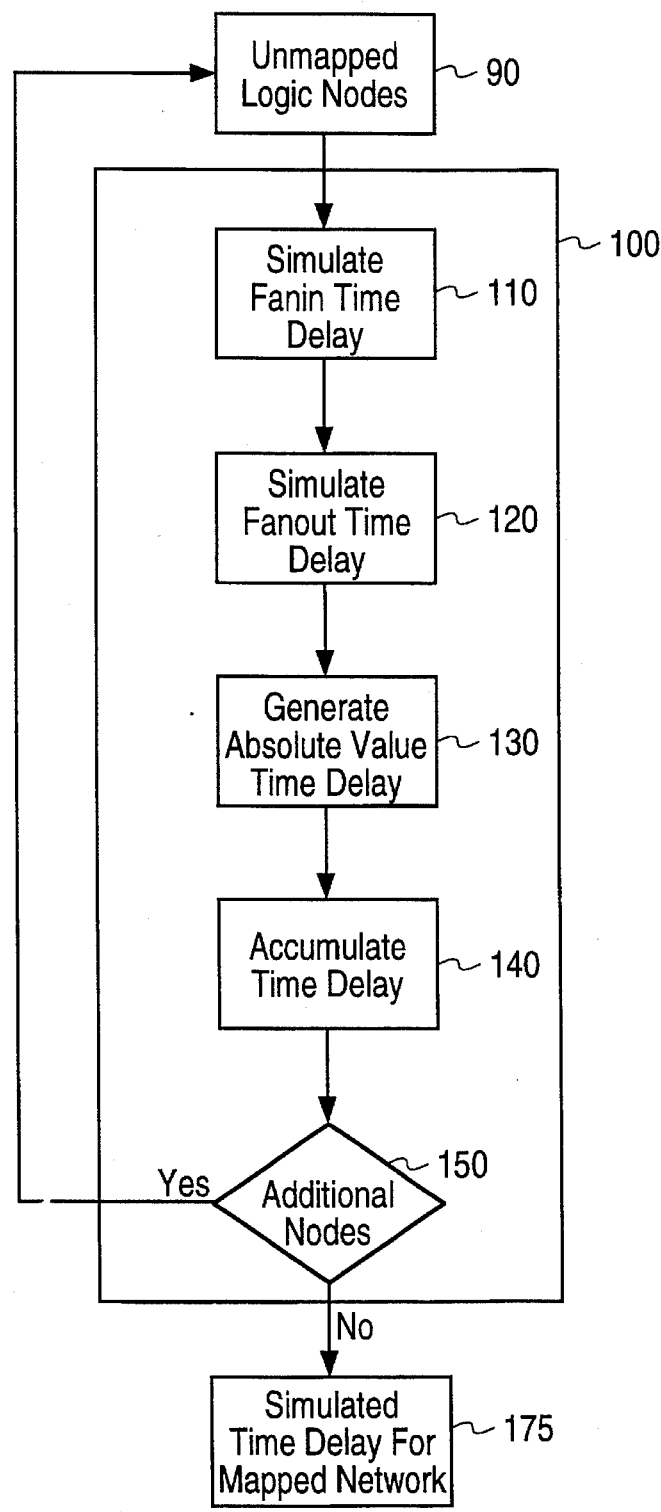
FIG. 2 is a block diagram of the method of this invention for simulating the time delay of a mapped and optimized circuit using only the logic nodes in the corresponding unmapped logic network.

Simulator 200 (FIG. 3) of this invention includes means for performing each of the steps in method 100 (FIG. 2). Specifically, means for simulating fanin time delay 210 generates a measure of the time delay of the mapped and optimized logic network associated with the fanin of a logic node in unmapped logic network 90. In parallel, in this embodiment, means for simulating fanout time delay 220 generates a measure of the time delay of the mapped and optimized logic network associated with the fanout of a logic node in the unmapped logic network.

Herein "associated with" means the time delay in the mapped and optimized logic network in the target technology that results from using the mapping and optimization method with the target technology to map the unmapped node with the specified fanin or alternatively the specified fanout. Also, as used herein, parallel does not mean that the structures necessarily perform the operations at the same time, but rather the structures receive the input signal directly from unmapped logic network 90 and process these signals independently of the other structures.

Means for generating absolute time values 230, in response to the signals from simulating means 210, 220 combines and scales the signals to obtain an absolute value of the time delay in the mapped and optimized logic network that is associated with the unmapped logic node being processed.

Absolute value time generator 230, in this embodiment, provides three absolute value time delay components. A first component is the absolute value of the time delay in the mapped and optimized logic network associated with the fanin of the unmapped logic node. The second component is the absolute value of the time delay in the mapped and optimized logic network associated with the fanout of the unmapped logic node. The third component is the intrinsic time delay of the logic nodes in the mapped and optimized logic network associated with the unmapped logic node. Hence, absolute value time generator 230 provides (i) a signal representing the absolute value of the total time delay and (ii) three signals representing each of the components that make-up the time delay.

The actual operation of absolute value time generator 230 is determined by the user. The user may select the output signal of absolute value time generator 230 as any one of the four output signals or any combination of the four output signals. For example, in one embodiment, generator 230 provides only the three time delay components described above and not the absolute value of the total time delay.

Finally, accumulator means 240, in response to the output signal or signals from generator means 230, generates a simulated time delay for the mapped and optimized logic network. The operation of accumulator means 240 is dependent upon the output signals from generator means 230.

Accumulator means 240 includes an accumulator for each signal from generator means 230 so that upon processing of all the unmapped logic nodes in network 90, a total time delay for network 90 is provided for each of the signals from means 230. Alternatively, for the example described above where generator means 230 provides only the three components of the total time delay, accumulator means 240 sums the accumulated values of the three components after all the unmapped logic nodes are processed. This sum is the total absolute value time delay. Since means 210, 220, 230 process one unmapped logic node at a time, the unmapped logic nodes in network 90 are sequentially supplied to structure 200, in this embodiment.

Since the method and structure of this invention generate the absolute value of the time delay for a specified target technology and a specified mapping and optimization method, information for use in (i) method steps 110, 120, 130 and (ii) in the operation of structures 210, 220, 230 is generated for each combination of target technology and mapping and optimization method. An important aspect of this invention is that the process used for each mapping and optimization method and target technology is identical, as described more completely below.

In addition to methods 100 and simulator 200, the individual steps in method 100 and the individual substructures in simulator 200 may be used to obtain delay time estimates for a mapped and optimized logic network for only fanin, only fanout, or any combination of fanin, and fanout. For example, in one embodiment, only method step 110 in method 100 and substructure 210 in simulator 200 are used to simulate the time delay of mapped and optimized logic networks based upon the fanin of logic nodes in the unmapped logic network. The important aspect is that the delay times obtained include the delay characteristics of both the target technology and the mapping and optimization method. Both of these characteristics were generally not accounted for in prior art methods.

Figure 3:
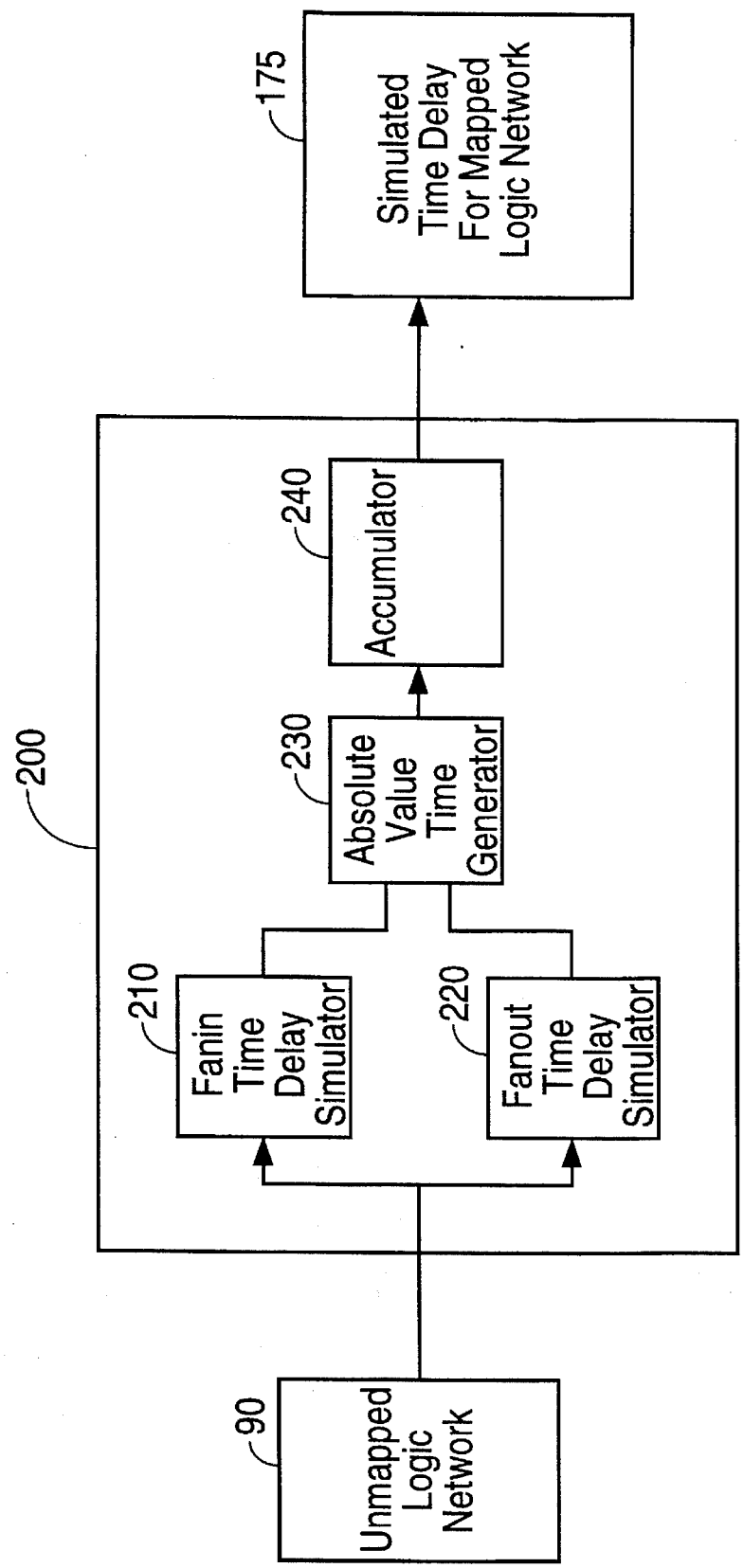
FIG. 3 is a block diagram of the simulator of this invention for generating the time delay of a mapped and optimized circuit using only the logic nodes in the corresponding unmapped logic network.
Figure 4:
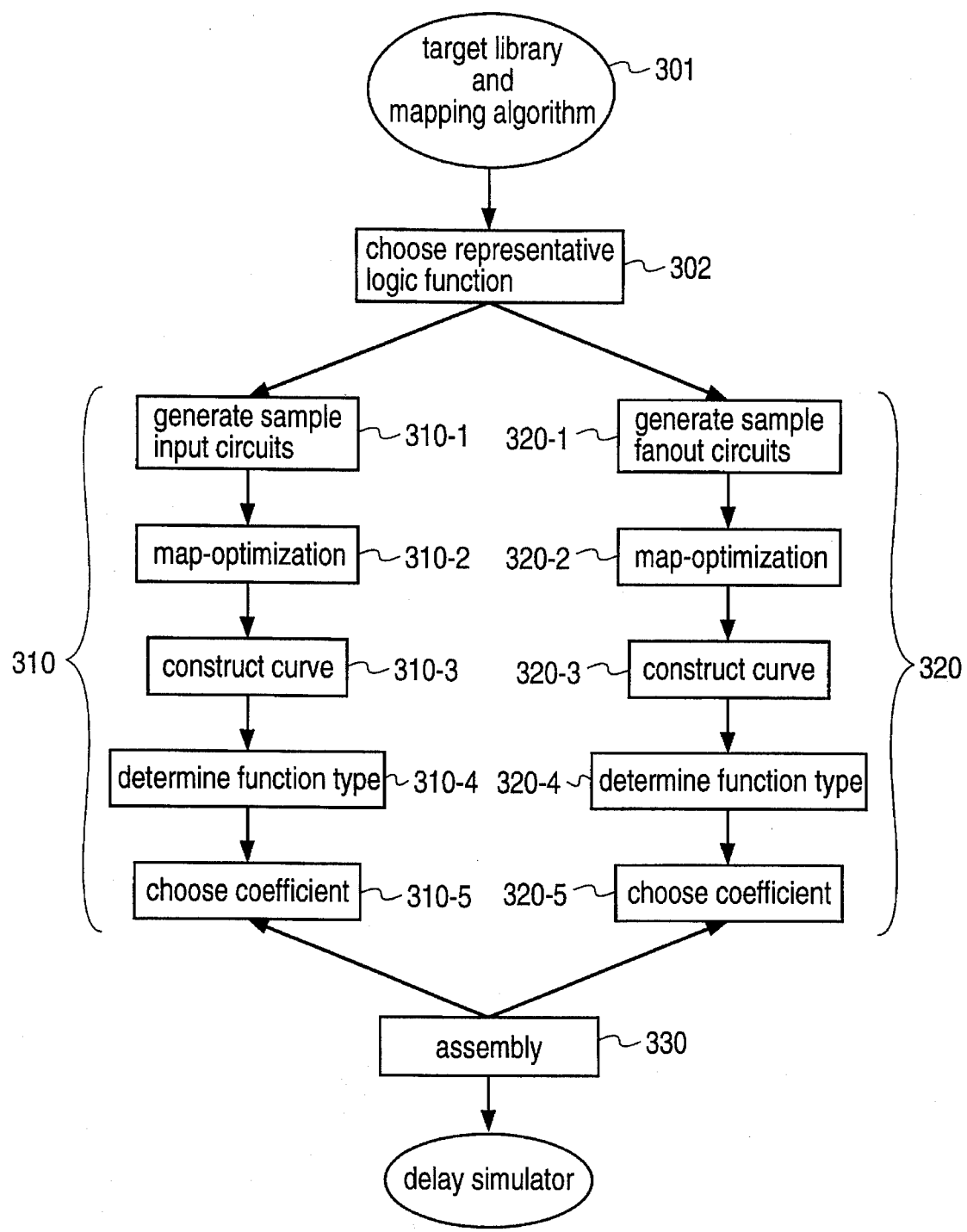
FIG. 4 is a block diagram of one embodiment for generating the delay time simulators used in the method and simulator of this invention.

As illustrated in FIG. 4, process 300 is used to generate the information used (i) in time delay simulation method 100 (FIG. 2) and (ii) in the operations of the time delay simulator 200 (FIG. 3). In selection step 301, both the mapping and optimization method and the target technology are selected. These selections are made by the user for the specific application. Process 300 imposes no constraints on the selection in step 301.

Selection of the target technology defines the library, called the target technology library (target library), for mapping the unmapped logic network. After step 301, a representative logic function or functions are chosen in step 302. Each chosen representative logic function is used in the subsequent steps of process 300 as described more completely below. According to the principles of this invention, there are two restrictions on the selection of the representative logic function in step 302. The restrictions are:

(i) any Boolean logic network can be represented by using only this logic function; and (ii) the complexity of the chosen logic function is fully characterized by the number of input signals(fanin) to the logic function, i.e., the logic function is symmetric with respect to the input signals.

Here, symmetric with respect to the input signals means that the input signals on any two input lines to the representative logic function can be swapped and the output signal of the logic function is not affected. If feasible, i.e., the logic function satisfies the two restrictions, the logic function that the selected mapping and optimization method is designed to use is preferably selected as the representative logic function. However, in general, the choice of the representative logic function is limited only by the above two restrictions.

For the purposes of illustration of the principles of this invention, a NOR gate was chosen as the representative logic function. NOR gates are suitable for representing any Boolean logic network. The complexity of the NOR gate is determined by the fanin to the gate, i.e., the gate output signal remains unchanged when the input signals on any two input lines to the gate are swapped. The selection of the NOR gate as the representative logic function is illustrative only and is not intended to limit the invention to the specific embodiments described below in terms of NOR gates. In view of this disclosure, one skilled in the art can implement the methods and structures of this invention using any representative logic function, e.g., NAND or XOR. Alternatively, multiple representative logic functions may be used to represent an unmapped logic networks. In this embodiment, the principles of this invention are used for each logic function of the multiple representative logic functions.

After step 302, process 300 branches into two parallel steps 310, 320. Each of these steps is described in turn. In step 310, the simulator for step 110 of method 100 and for means 210 of structure 200 is generated. According to the principles of the invention, a logic node in the unmapped logic network is analyzed and the time delay for that logic node is generated. Therefore, step 310 is defined for an arbitrary logic node g in the unmapped logic network. For example, one unmapped logic network 90 is illustrated in FIGS. 1A–1F. Unmapped logic network 90 includes seven invertors 91-1 to 91-7, 28 two input line NOR gates 92-1 to 92-28, 9 three input line NOR gates 93-1 to 93-9, 4 four input line NOR gates 94-1 to 94-4, and one six input line NOR gates 96-1.

Step 310 captures the time delay of the mapped and optimized logic network for the target technology associated with unmapped logic node g as a function of the number of input lines to unmapped logic node g. More generally, step 310 produces a means for capturing the change in delay time in the mapped and optimized logic network in the target technology for a change in fanin of an unmapped logic node.

The time delay simulator for the mapped and optimized logic network associated with the fanin of logic node g in unmapped logic network 90, in one embodiment, is represented in step 310 as:

$$\tilde{t}_g^{fanin} = C_i F_i(I(g)) + D_i \quad (1)$$

where $\tilde{t}_g^{fanin}$=the fanin time delay and the intrinsic time delay associated with the logic nodes generated in the mapped and optimized logic circuit for the fanin of unmapped logic node g;

$I(g)$=number of input lines(fanin) to logic node g;

$F_i(N)$=value of a function $F_i$ at point N where N is an integer;

$C_i$=a constant or set of constants for scaling function $F_i$ so that the product $C_i F_i(N)$ simulates the mapped and optimized time delay for an unmapped logic node having a fanin of N; and $D_i$=a constant that displaces time delay $C_i F_i(N)$ so that upon scaling of time delay $\tilde{t}_g^{fanin}$=an absolute value simulation of the actual time delay in the mapped and optimized logic networks is generated for unmapped logic node g having a fanin of N.

Hence, the operations in step 310 determine function $F_i$ and coefficient $C_i$ and constant $D_i$, as described more completely below.

In generate circuits step 310-1, a multiplicity of sample logic networks are generated using the representative logic function. The sample logic networks have the range of fanin expected in unmapped logic networks of interest. Specifically, (n–i+1) or less sample logic networks are generated where the first sample logic network has a fanin of i; the last sample logic network has a fanin of n; and n and i are selected integers where n is greater than or equal to (i+1).

As is known to those skilled in the art, a fanin of 10, i.e., n=10, is most likely too small, while a fanin of 50,000, i.e., n=50,000, is probably too large. The important aspect is to select integers i and n that bound the range of fanins for all anticipated unmapped logic networks because if too small a fanin range is selected, the reliability of the fanin delay time simulation is not known. However, if too large a fanin range is selected, the method of this invention requires additional resources, e.g., the time required in developing the delay time simulators, that are not effectively used.

In one embodiment, the fanin range in step 310-1 was from a fanin of 2 to a fanin of 800. In this embodiment in step 310-1, a multiplicity of NOR gates were generated where the NOR gates had fanins ranging from two through 800, i.e., the multiplicity of NOR gates were the sample logic networks.

Specifically, in this embodiment, for the fanin range from 2 through 100, a NOR gate was generated for fanins of 2, 25 and 50 for a total of 3 NOR gates. For the fanin range from 100 through 600, NOR gates with a fanin divisible by 100 were generated, i.e., the fanin increased by steps of 100, for a total of 6 NOR gates. For the fanin range from 600 to 800, the fanin was increased in a step of 200 (1 NOR gate). Thus, step 310-1 generated a total 10 NOR gates for the fanin range from 2 through 800.

Other distributions of sample logic networks, i.e., the total number of NOR gates in the above example, spanning the fanin range may be used. Typically, for a good mapping and optimization method, as defined more completely below, and large values of fanin, as the fanin increases, e.g. from 300 to 301, the absolute change in the magnitude of the delay time varies slowly with the increase in fanin. Therefore, the change in time delay for large fanins is adequately captured using larger fanin intervals. Thus, in general terms, in step 310-1, a multiplicity of logic networks having fanins that span a selected fanin range, sometimes referred to as a predetermined fanin range, are generated. Preferably, each of the logic networks is a single logic node.

Within step 310, second step 310-2 maps each of the multiplicity of sample logic networks using the selected mapping and optimization method and the target technology library. In each mapping and optimization of process 300, the sample logic network is optimized for speed.

Mapping and optimization methods are well known to those skilled in the art. For example, see E. Detjens, G. Gannot, R. Rudell, A. Sangiovanni-Vincentelli, and A. Wang "Technology Mapping in MIS", *Proceedings International Conference on Computer-Aided Design* (ICCAD-87), pages 116–119, November 1987; K. Keutzer "Dagon: Technology Binding and Local Optimization By DAG Matching," *Proceedings 24th Design Automation Conference*, pages 341–347, June 1987; M. Lega, "Mapping Properties of Multi-level Logic Synthesis Operations", *Proceedings International Conference on Computer Design* (ICCD-88), pages 257–261, October 1988; and D. C. Schmidt and G. Metze, "Modular Replacement of Combinational Switching Networks," *IEEE Transactions on Computers*, C24:29–48, January 1975, which are incorporated herein by reference in their entirety as examples of such known methods.

In one embodiment, the mapping and optimization process is a sequence of four optimization processes. The four optimization processes are:

i) cell selection as described in E. Detjens, G. Gannot, R. Rudell, A. Sangiovanni Vincentelli, and A. Wang. "Technology Mapping in MIS", *Proceedings International Conference on Computer-Aided Design* (ICCAD-87), pages 116–119, November 1987; and R. Rudell, *Logic Synthesis for VLSI Design*, Ph.D. Thesis, University of California, Berkeley, 1989, which are incorporated herein by reference;

ii) phase-assignment as described in R. Brayton, R. Rudell, A. Sangiovanni-Vincentelli, and A. Wang, "MIS: A Multi-Level Logic Optimization System," *Trans. Comp. Aided Design*, CAD-6(6), pp. 1062–81, November 1987; and A. Wang, *Algorithms for Multi-Level Logic Optimization*, Ph.D. Thesis, University of California, Berkeley, 1989, which are incorporated herein by reference;

iii) sizing, which is a specific version of cell-selection as described in step i, replaces one gate at a time in a greedy fashion with another gate having the same function but different electrical parameters. Here, "in a greedy fashion" means the objective function is optimized only with respect to the parameter under consideration; and iv) buffering as described in C. Berman, J. Carter, and K. Day, "The Fanout Problem: From Theory to Practice," *Proceedings of the* 1989 Dicennial CalTec Conference, pp. 69–99, 989; and Herve' J. Touati, Cho W. Moon, Robert K. Brayton, and Albert Wang, "Performance-oriented technology mapping," *Advanced Research in VLSI, Proceedings of the Sixth MIT Conference*, pages 79–97. MIT Press, 1990, which are incorporated herein by reference.

In one embodiment using these four procedures, a logic circuit is mapped and optimized by first using cell selection to generate an initial mapped logic circuit. Typically, in this process a cost function is optimized. The cost function is, for example, a user selected function of speed, silicon area and power consumption. Sizing is then used to improve the circuit speed. Subsequently, phase assignment improves the circuit speed further. Next, phase assignment reduces the area of the circuit without increasing the time delay of the circuit. Sizing improves the circuit speed and then buffering maximally improves the circuit speed. Subsequently, buffering is used to reduce the area of the circuit again without effecting the speed of the circuit. Finally, sizing is used to attempt to further improve the circuit speed. This method is incorporated in a Design Compiler 1.3, which is available from Synopsys, Inc. of Mountain View, Calif.

As mentioned above, the particular mapping and optimization method selected by the user is not an essential aspect of this invention. The methods and structures of this invention are applicable for any mapping and optimization method of interest to the user. Therefore, the results obtained with the particular mapping and optimization method used are illustrative only of the principles of the invention and are not intended to limit the invention to the particular mapping and optimization method.

Figure 5:
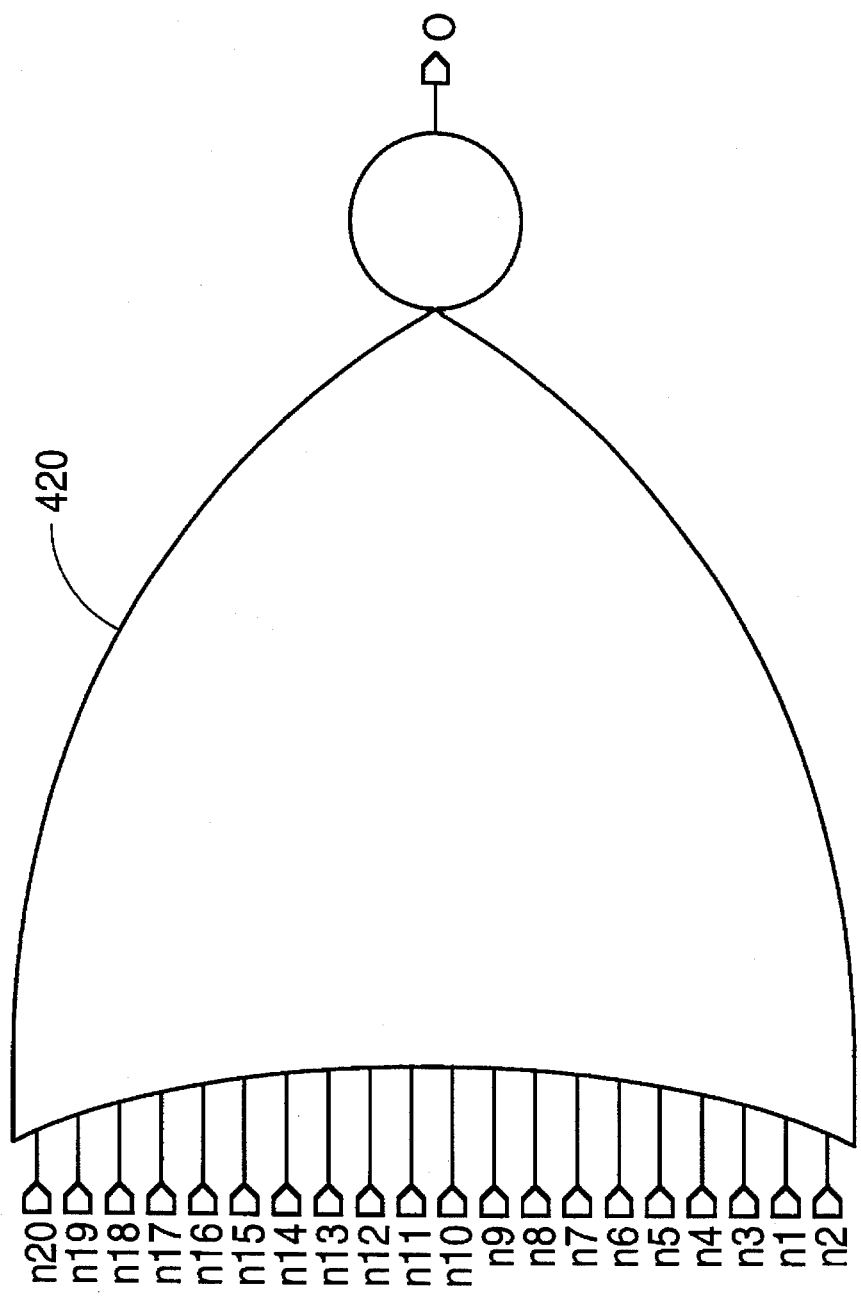
FIG. 5 is an example of one embodiment of one sample fanin logic network according to the principles of this invention.

For illustration of the mapping and optimization, a sample circuit with a fanin of twenty, NOR gate 420 with a fanin of twenty, (FIG. 5) was used along with the target library given below in TABLE 1. As previously described, typically a manufacturer provides the target library for each fabrication line. However, these target libraries are usually considered confidential by the manufacturer. Therefore, the target technology library is the iwls89.1ib2 library. This library was generated by the program committee of the International Workshop on Logic Synthesis held at the MicroElectronics Company of North Carolina (MCNC), Research Triangle Park, North Carolina on May 23–25, 1989. The iwls89.lib2 library is a standard target technology library that is used for comparing logic synthesis and optimization algorithms.

TABLE 1

Example of a Target Technology Library

| | |
|---|---|
| $0 = \bar{a}$; | # inverter |
| $0 = ((\bar{a} * b) = (a * \bar{b}))$; | # XOR |
| $0 = ((\bar{a} * \bar{b}) + (a * b))$; | # XNOR |
| $0 = \overline{(a*b)}$; | # NAND2 |
| $0 = \overline{(a*b*c)}$; | # NAND3 |
| $0 = \overline{(a*b*c*d)}$; | # NAND4 |
| $0 = \overline{(a + b)}$; | # NOR2 |
| $0 = \overline{(a + b + c)}$; | # NOR3 |
| $0 = \overline{(a + b + c + d)}$; | # NOR4 |
| $0 = \overline{((a1*a2) + b)}$; | # AOI21 |
| $0 = \overline{((a1*a2*a3) + b)}$; | # AOI31 |
| $0 = \overline{((a1*a2) + (b1*b2))}$; | # AOI22 |
| $0 = \overline{((a1*a2*a3) + (b1*b2))}$; | # AOI23 |
| $0 = \overline{((a1*a2*a3) + (b1*b2*b3))}$; | # AOI33 |
| $0 = \overline{((a1*a2) + b + c)}$; | # AOI211 |
| $0 = \overline{((a1*a2) + (b1*b2) + c)}$; | # AOI221 |
| $0 = \overline{((a1*a2) + (b1*b2) + (c1*c2))}$; | # AOI222 |
| $0 = \overline{((a1 + a2) *b)}$; | # OAI21 |
| $0 = \overline{((a1 + a2 + a3) *b)}$; | # OAI31 |
| $0 = \overline{((a1 + 2) * (b1 + b2))}$; | # OAI22 |
| $0 = \overline{((a1 + a2 + a3) * (b1 + b2))}$; | # AOI32 |
| $0 = \overline{((a1 + a2 + a3) * (b1 + b2 + b3))}$; | # OAI33 |
| $0 = \overline{((a1 + a2) *b*c)}$; | # OAI211 |
| $0 = \overline{((a1 + a2) * (b1 + b2) *c)}$; | # OAI221 |
| $0 = ((a1 + a2) * (b1 + b2) * (c1 + c2))$; | # OAI222 |

Each gate in this target library has a set of time delay parameters which are used to compute the signal propagation delay from an input terminal of the gate to the gate output terminal. The set of delay parameters specify (i) the intrinsic time delay of the gate, (ii) the time delay change with the total capacitance at the output terminal of the gate, and (iii) the capacitance of a gate input terminal as seen by another gate driving that input terminal.

Figure 6:
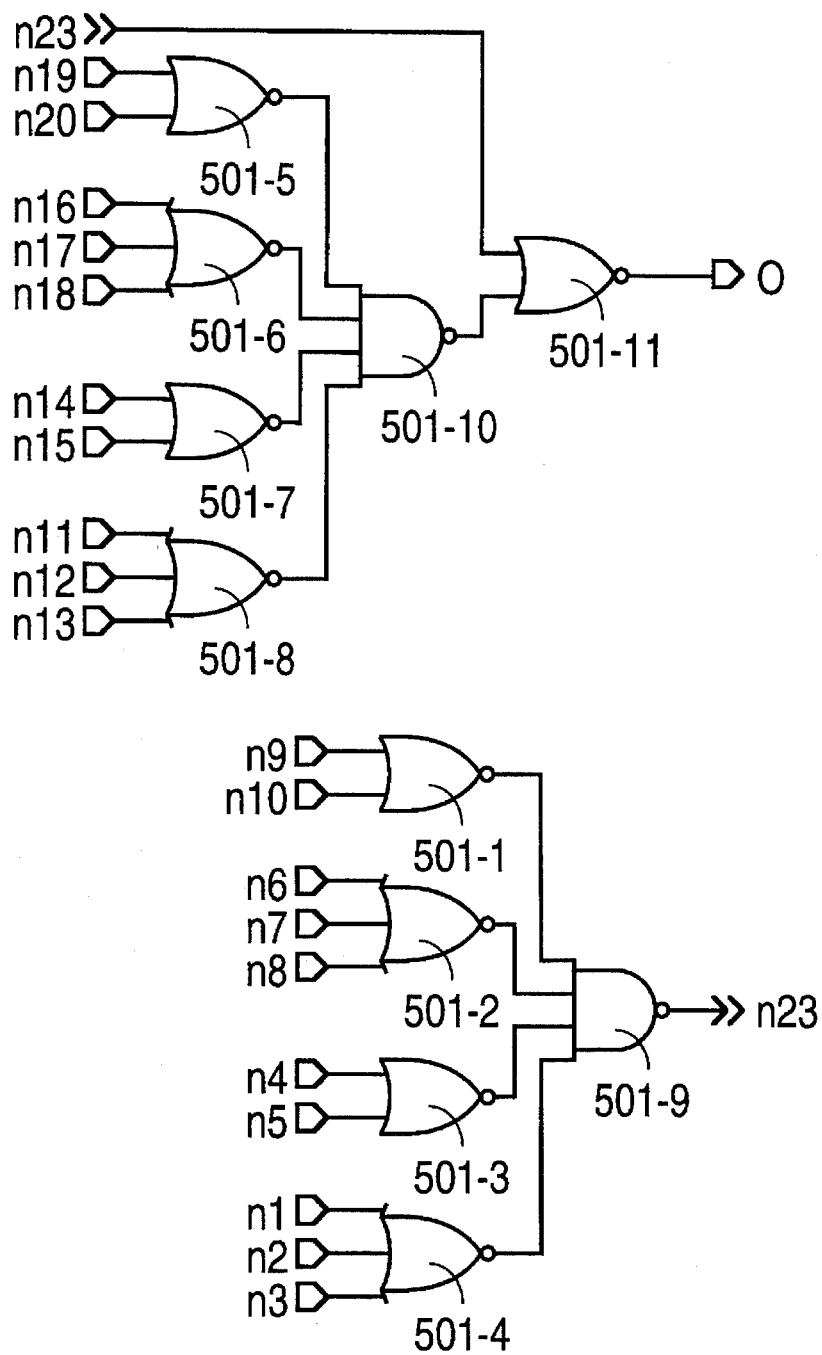
FIG. 6 is an example of one embodiment of a mapped and optimized logic network corresponding to the sample logic network of FIG. 5.

The target technology library ("target library") is also not a critical aspect of this invention because the principles of this invention are applicable to any target technology, and consequently any target library chosen by the user. Using the library of TABLE 1 and the mapping and optimization method described above unmapped NOR gate 420 with a fanin of twenty (FIG. 5) was mapped to logic network 500 (FIG. 6). (In the Figures, a line with double arrowheads and reference numerals is connected to another line with the same reference numeral. For clarity, the complete line is not shown.)

In mapped logic network 500, output NOR gate 501-11 is driven by output signals from four input line NAND gates 501-10, 501-9. The input signals for NAND gate 501-9 are derived from signals n1 to n10. Signals n9, n10 drive NOR gate 501-1 and signals n6, n7, n8 drive NOR gate 501-2. Signals n4, n5 drive NOR gate 401-3 and signals n1, n2, n3 drive NOR gate 501-4. The output signals of NOR gates 501-1 to 501-4 drive NAND gate 501-9.

The derivation of the input signals to NAND gate 501-10 is identical to the one just described for NAND gate 501-9 using input signals n13 to n20 and NOR gates 501-5 to 501-8. Accordingly, the remainder of mapped logic network 500 is not described in more detail.

The important aspect is that each of the unmapped logic networks generated in step 310-1 are mapped in step 310-2. After the mapping, the actual time delay for signal propagation from the input to the output terminal of each mapped logic network is determined using time delay information provided with the target library. The propagation delays are accumulated, in one embodiment, according to the method described in R. Brayton, R. Rudell, A. Sangiovanni-Vincentelli, and A. Wang, "MIS: A Multi-Level Logic Optimization System," *Trans. Comp. Aided Design*, CAD-6(6), pp. 1062–81, November 1987, which is incorporated herein by reference, to yield the total time delay from an input terminal of the mapped logic network to an output terminal of that logic network. The method for determining the actual time delay of a mapped logic network or the actual time delay between an input terminal and an output terminal of a mapped logic network is well known to those skilled in the art.

At the end of step 310-2 (FIG. 4), a table is available containing (n–i+1) rows where each row includes an unmapped sample logic network fanin and the corresponding time delay for the mapped and optimized logic network for that fanin. Hence, information relating fanin for an unmapped logic node, i.e., one of the unmapped sample logic networks with a specified fanin, to a corresponding delay time for the mapped and optimized logic network is available. This information may be processed in numerous ways to generate a means for capturing the change in delay time in the mapped and optimized logic network with a change in fanin of the unmapped logic node. For example, a lookup table is generated in one embodiment. The lookup table is used in method step 110 (FIG. 2) and in simulator 210 (FIG. 3) to generate time delay $\tilde{t}_g^{fanin}$.

For example, in method step 110, the simulated delay time $\tilde{t}_g^{fanin}$ associated with the fanin of a logic node in an unmapped logic network is obtained from the lookup table, using interpolation if necessary. Similarly, in means 210, the fanin value for the unmapped logic node is supplied to means 210 and means 210 processes the fanin value in conjunction with the lookup table and generates the simulated delay time $\tilde{t}_g^{fanin}$ associated with the unmapped logic node in the mapped and optimized logic network.

Figure 7:
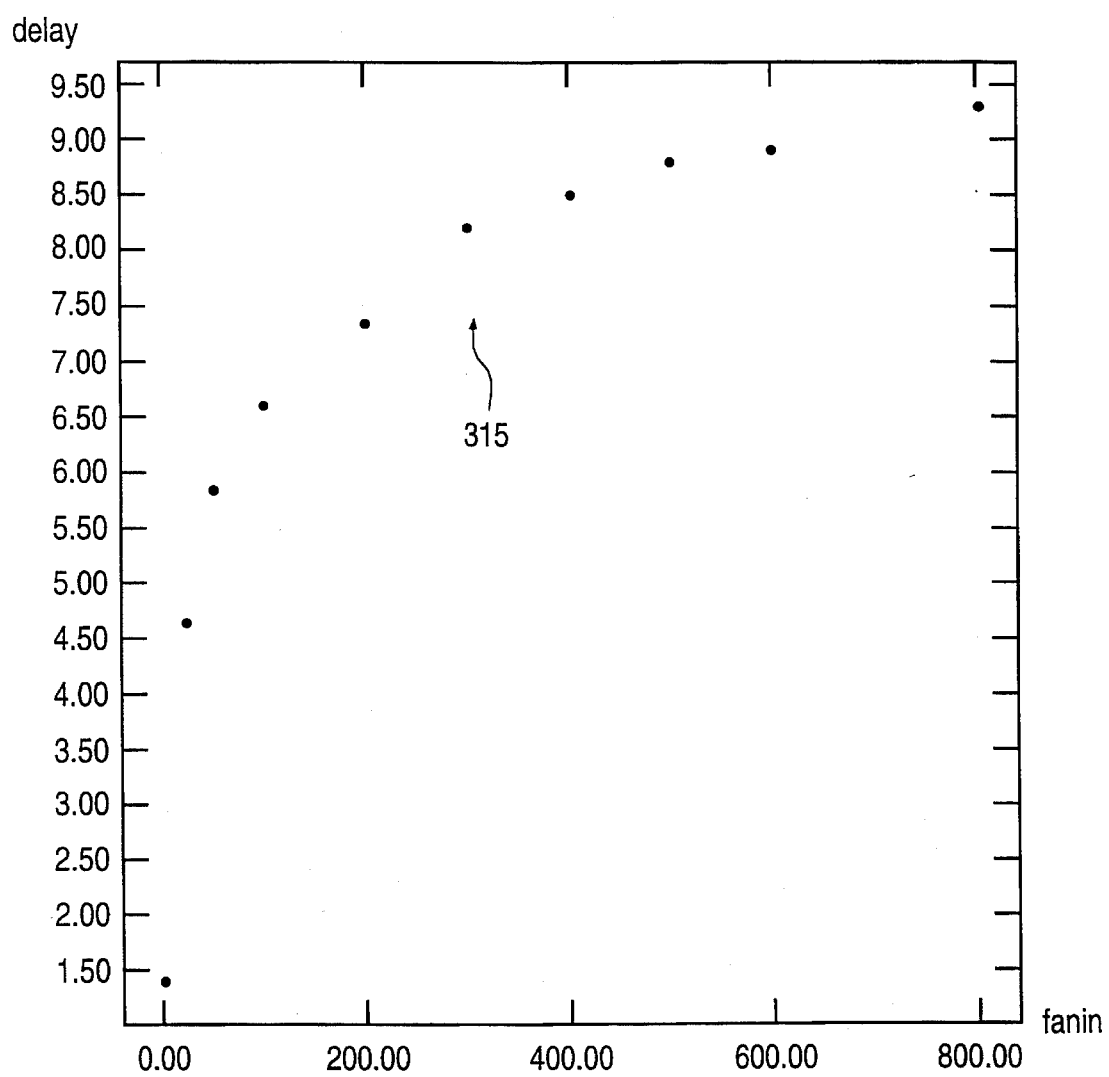
FIG. 7 is a linear plot of the fanin time delay data generated by the mapping and optimization of the sample circuits that span the fanin range selected by the user.

However, while a detailed lookup table may provide accurate results, construction of the lookup table is costly. The generation of a lookup table in real time is particularly costly. Thus, preferably, the data from step 310-2 (FIG. 4) are used in generate curve step 310-3. Specifically, fanin is represented along a horizontal axis (FIG. 7) and time delay for the mapped and optimized logic network is represented along the vertical axis. Each row in the table from step 310-2 is plotted on this coordinate system so that data plot 315 is obtained. FIG. 7 illustrates the plotted data for the range of fanin from 2 through 800, described above, in step 310-2. The plotted data are the actual time delays in the mapped and optimized logic network for the unmapped logic node having the fanin given on the horizontal axis. Hence, data plot 315 (FIG. 7) is a representation of the information in the table generated by step 310-2 (FIG. 4).

In select function step 310-4, a function $F_i$ is chosen, that approximates the functional relationship depicted by data 315. In one embodiment, the function selection is empirical. Preferably, the function is chosen from the group of functions consisting of constant, linear, quadratic, square root, and logarithmic. Typically, a single function is selected to cover the entire fanin range. However, the objective is to select a function that most closely approximates the plotted data. The selected function may be a combination of several functions if necessary. For example, the function may be a constant over a first portion of the fanin range and a linear function over the remainder of the fanin range.

While in the previous embodiment the function selection was empirical, in another embodiment, the function selection is performed using fitting methods similar to those described more completely below. In this embodiment, the fit of each of functions in the group of functions consisting of constant, linear, quadratic, square root, and logarithmic to the data, or alternatively the fit of each of a selected subgroup of the functions is determined using the fitting method. The function that fits the data the best, as determined by the fitting method, is selected.

Figure 8:
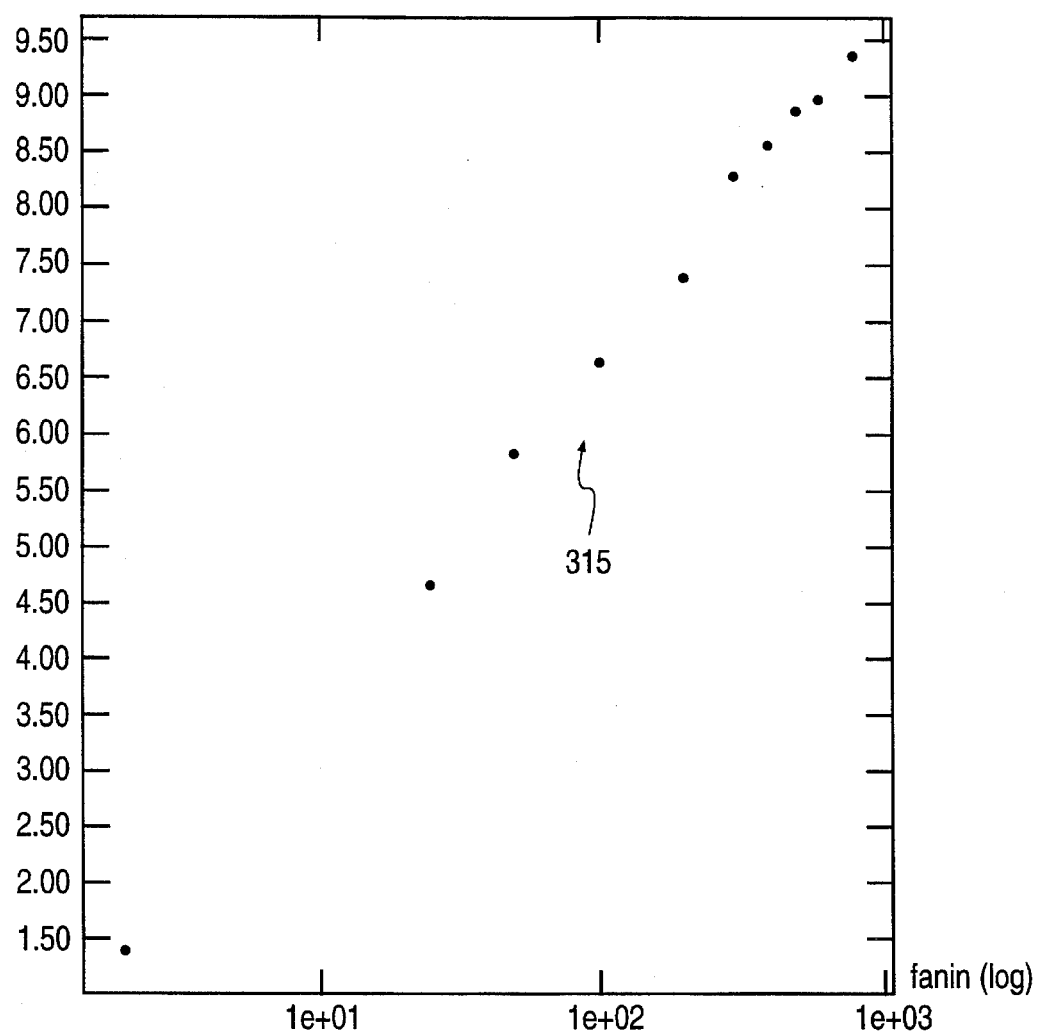
FIG. 8 is a semi-log plot of the fanin data presented in FIG. 7.

Returning to the empirical method of function selection, over the range of fanin in FIG. 7 a logarithmic function was selected. To verify that the function relationship between the delay time and the fanin was approximately logarithmic, the data in FIG. 7 were replotted. The delay time was plotted on a vertical linear scale (FIG. 8) and the fanin was plotted on a horizontal logarithmic scale. This type of representation is generally referred to as a semi-log plot.

The data points on the semi-log plot (FIG. 8) generally fell about a straight line. Thus, the selection of the function "log" for function $F_i$ approximates the function represented by the data in FIG. 7.

In yet another embodiment, the function selection step is based upon knowledge of the operation of the mapping and optimization method. In general, for a "good" mapping and optimization method, the functional relationship between time delay and fanin is logarithmic because the mapping and optimization method adds components as the fanin increases. Thus, for a mapping and optimization method that is known to be good, a logarithmic function is chosen in step 310-4 (FIG. 4). Hence, in this embodiment, neither empirical selection based upon plotted data nor a fitting process is used in function selection process 310-4. Conversely, in some mapping and optimization methods, components are not added as the fanin increases. The result is that typically such methods result in a constant time delay as the fanin increases. Therefore, in this case, based upon this knowledge of the mapping and optimization process, a constant function is selected in step 310-4. Preferably, selection of a function based solely upon knowledge of the mapping and optimization method is not performed until several target technology libraries have been used with the mapping and optimization method according to the principles of this invention including the more detailed function selection process described above.

Function selection process 310-4, e.g. the selection of log(I(g)) in this example, (herein "log" means the base 2 logarithm) captures the functional change in delay time of the mapped and optimized logic network as the fanin in the unmapped logic network changes. However, a set of coefficients $C_i$ and a constant $D_i$ are required to capture the variations in delay time associated with the target technology. In most instances, the set of coefficients contains only a single member. Thus, in the following discussion, only one coefficient $C_i$ is described.

Coefficient $C_i$ and constant $D_i$ are generated in chose coefficients step 310-5 (FIG. 4). Procedures for fitting a function to a set of data points to determine coefficient $C_i$ and constant $D_i$ are well known to those skilled in the art. For example, an entire chapter is devoted to such procedures in W. Press, B. Flannery, S. Teukolsky and W. Vetterling, *Numerical Recipes in C,* Chapter 14, pp. 517–565, Cambridge University Press 1988. In one embodiment, a minimum variance estimator also referred to as a maximum likelihood estimator, obtained by a least-squares fit, was used. Specifically, the fitting method was taken directly from W. Press, et al., *Numerical Recipes in C,* Chapter 14, Section 2, which is incorporated herein by reference. Fitting equation y=a+b(log(x)) to a set of data (log($xp_i,y_i$)) is equivalent to fitting y=a+bz to data (log($x_i$),$y_i$) where z=log(x).

The fitting method is typically selected to minimize the computer resources used in the fitting, in particular, the time required for the fitting. Selecting a fitting method that minimizes computer resource requirements facilitates use of the method and structure of this invention for a wide variety of target technologies and mapping and optimization methods.

Figure 9A:
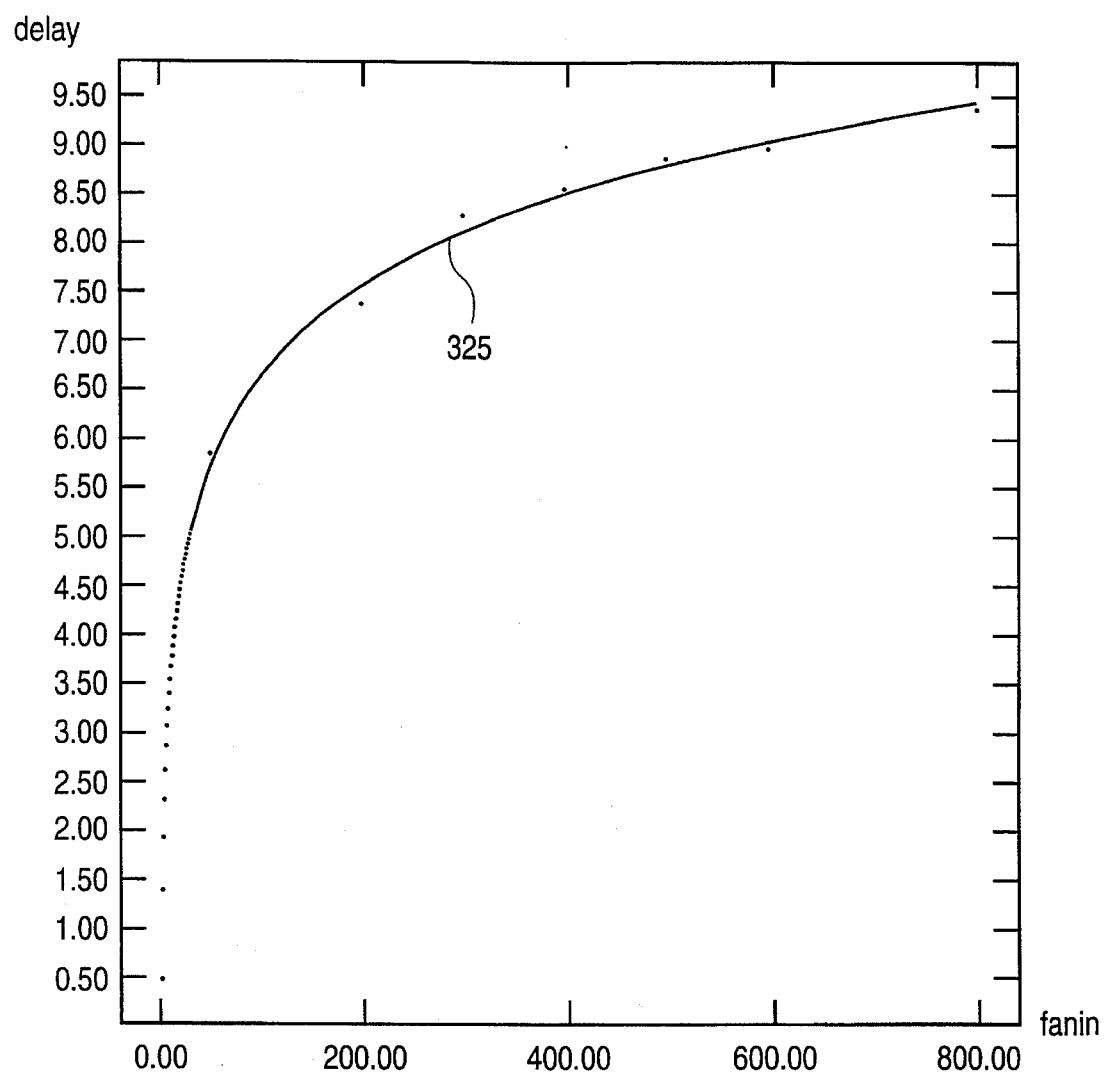
FIGS. 9A and 9B illustrate on a linear and semi-log plot respectively the fanin time delay generated using fanin time delay simulator of this invention.
Figure 9B:
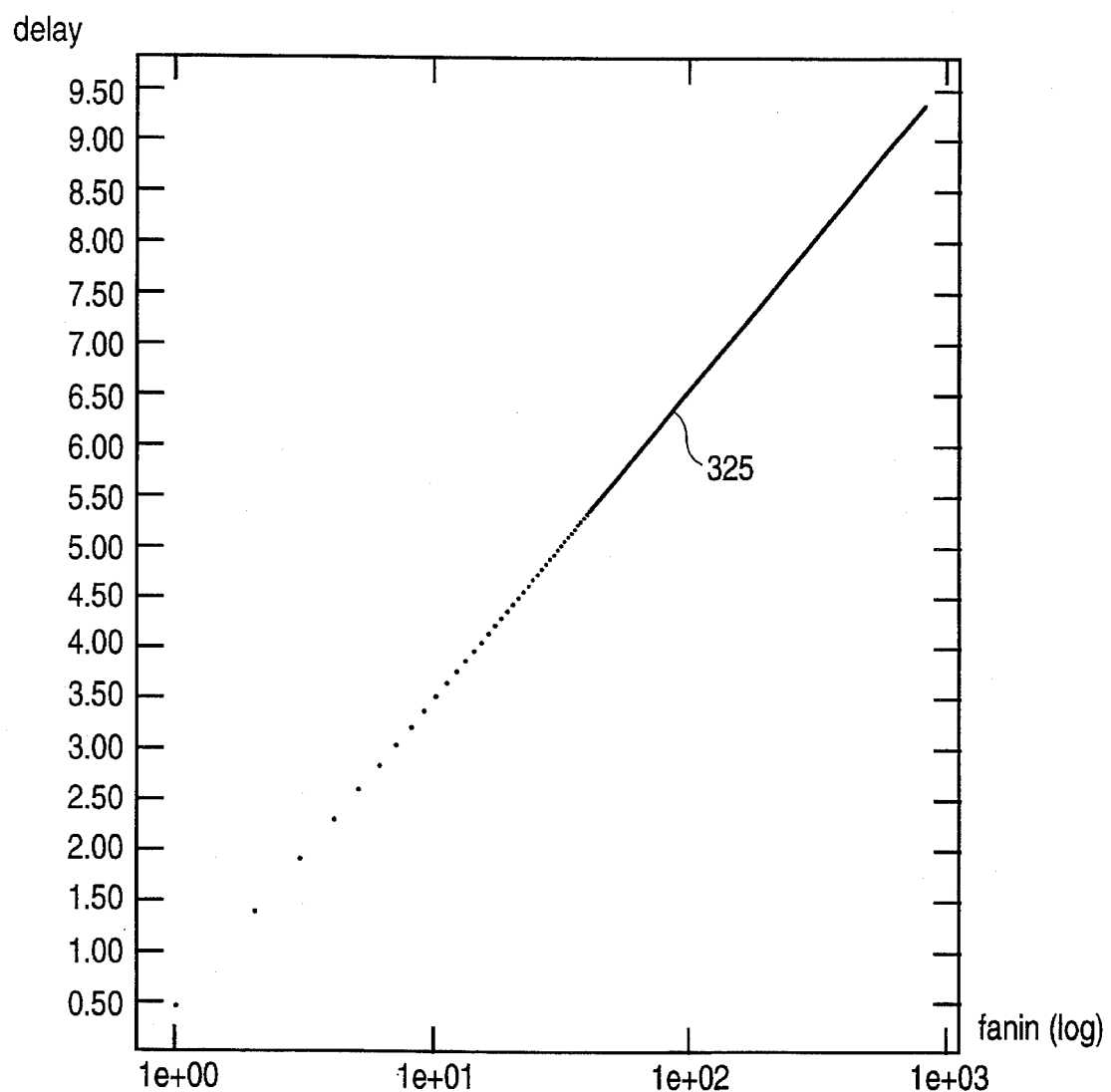

Using the minimum variance estimator described above for data in FIG. 7, coefficient $C_i$ and constant $D_i$ were determined. A value of 0.92 for coefficient $C_i$ and a value of 0.47 for constant $D_i$ were obtained Delay time $\tilde{t}_g^{fanin}$ using coefficient $C_i$ function log(I(g)) and constant $D_i$ is illustrated as curve 325 in FIGS. 9A and 9B. The generation of coefficient $C_i$ and constant $D_i$ completes step 310.

As a result of step 310, a means for simulating fanin time delay in the mapped logic network using only the fanin associated with an unmapped logic node is generated. The simulated fanin time delay includes not only the fanin time delay but also the intrinsic time delay associated with fanin. In this embodiment, the time delay generated using the fanin for each node in the unmapped logic network is a relative value estimate.

Similar to step 310, step 320 (FIG. 4) determines the delay time including the intrinsic time delay in the mapped and optimized logic network associated with the fanout of logic node g in the unmapped logic network. As the fanout at logic node g increases, the capacitance also increases, which in turn changes the signal propagation time delay, as is known to those skilled in the art. Step 320 captures the time delay of the mapped and optimized logic network in the target technology associated with unmapped logic node g as a function of the number of input lines driven directly by the output signal of unmapped logic node g. More generally, step 320 produces a means for capturing the change in delay time in the mapped and optimized logic network in the target technology for a change in fanout of an unmapped logic node.

The time delay for the mapped and optimized logic network associated with the fanout from unmapped logic node g, in one embodiment, is represented in step 320 as:

$$\tilde{t}_g^{fanout}=C_oF_o(O(f))+D_o \qquad (2)$$

where $\tilde{t}_g^{fanout}$=fanout time delay and the intrinsic time delay associated with the logic nodes generated in the mapped and optimized logic circuit for the fanout of unmapped logic node g;

O(g)=number of logic node input lines driven directly by the output signal on the output line(fanout) from logic node g;

$F_o(N)$=value of a function $F_o$ at point N where N is an integer;

$C_o$=a constant or set of constants for scaling function $F_o$ so that the product $C_oF_o(N)$ simulates the mapped and optimized time delay for an unmapped logic node having a fanout of N; and $D_o$=a constant that displaces time delay $C_oF_o(N)$ so that upon scaling of time delay $\tilde{t}_g^{fanout}$ an absolute value simulation of the actual time delay in the mapped and optimized logic network is generated for unmapped logic node g having a fanout of N.

Hence, the operations in step 320 determine function $F_o$ and coefficient $C_o$ and constant $D_o$, as described more completely below.

In generate circuits step 320-1, a multiplicity of sample logic networks are generated using the representative logic function. The sample logic networks must have the range of fanout expected in unmapped logic networks of interest. Specifically, (m–j+1) or less sample logic networks are generated where the first sample logic network has a fanout of j and the last sample logic network has a fanout of m, and where m and j are selected integers such that m is greater than or equal to (j+1).

As is known to those skilled in the art, a fanout of 10, i.e., m=10 is most likely too small while a fanout of 50,000, i.e., m=50,000 is probably too large. The important aspect is to select integers j and m that bound the range of fanouts for all anticipated unmapped logic networks because if too small a fanout range is selected the reliability of the fanout delay time simulation is not known. However, if too large a fanout range is selected, the method of this invention requires additional resources, e.g., the time required in developing the delay time simulators, that are not effectively used.

In one embodiment, the fanout range is in step 320-1 was from a fanout of 2 to a fanout 800. Thus, in this embodiment of step 320-1, a multiplicity of NOR gates were generated where the NOR gates had fanouts ranging from two through 800. Thus, the NOR gates were the sample logic networks having fanouts that spanned the selected fanout range. Specifically, in this embodiment, for the fanout range from 2 through 100, a NOR gate was generated for fanouts of 2, 25, and 50 for a total of 3 NOR gates. For the fanout range from 100 through 600, NOR gates with fanouts divisible by 100 were generated, i.e., the fanout increased by steps of 100, for a total of 6 NOR gates. For the fanout range from 600 to 800, the fanout was increased in a step of 200 (1 NOR gate). Thus, steps 320-1 generated a total of 10 NOR gates for the fanout range from 2 through 800.

As explained above for fanin, other distributions, i.e., total number of NOR gates in the above example, spanning the fanout range may be used. As for fanin, for a good mapping and optimization method and large fanouts, as the fanout increases, the absolute change in the magnitude of the delay time varies slowly with an increase in fanout. Therefore, the change in delay time for large fanouts is adequately captured using larger fanout intervals. Also, while in this embodiment the same distribution was used for fanin and fanout, this is not a requirement of the method. In general terms, in step 320-1, a multiplicity of logic networks having fanouts that span a selected fanout range are generated.

Within step 320, second step 320-2 maps each of the multiplicity of logic networks generated using the selected mapping and optimization method and the target technology library. As mentioned above, the particular mapping and optimization method is not an essential aspect of this invention, because the method of this invention is applicable for any mapping and optimization method of interest to the user.

Figure 10:
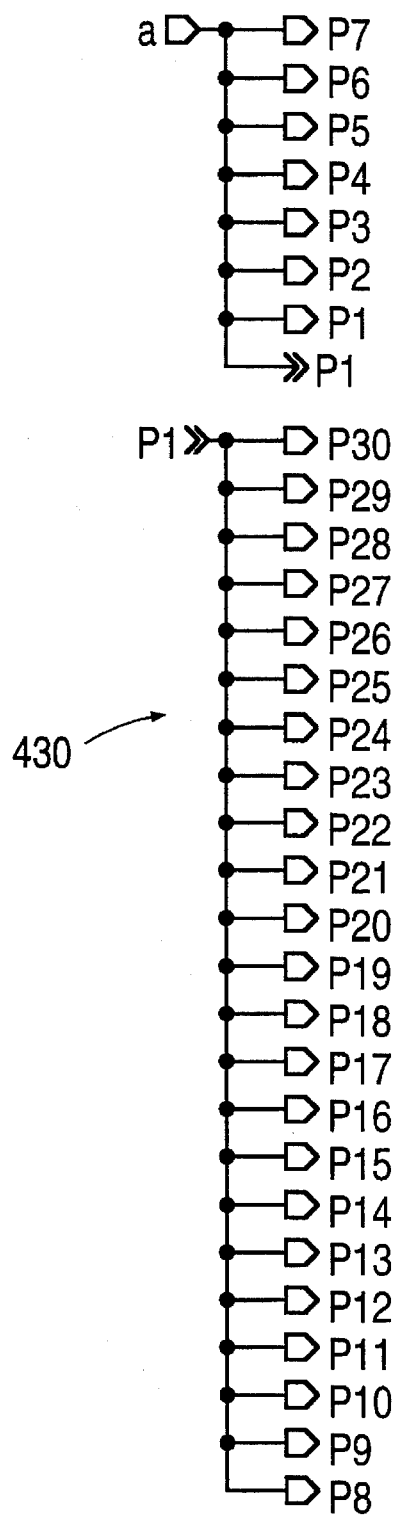
FIG. 10 is an example of one embodiment of one sample fanout logic network according to the principles of this invention.
Figure 11:
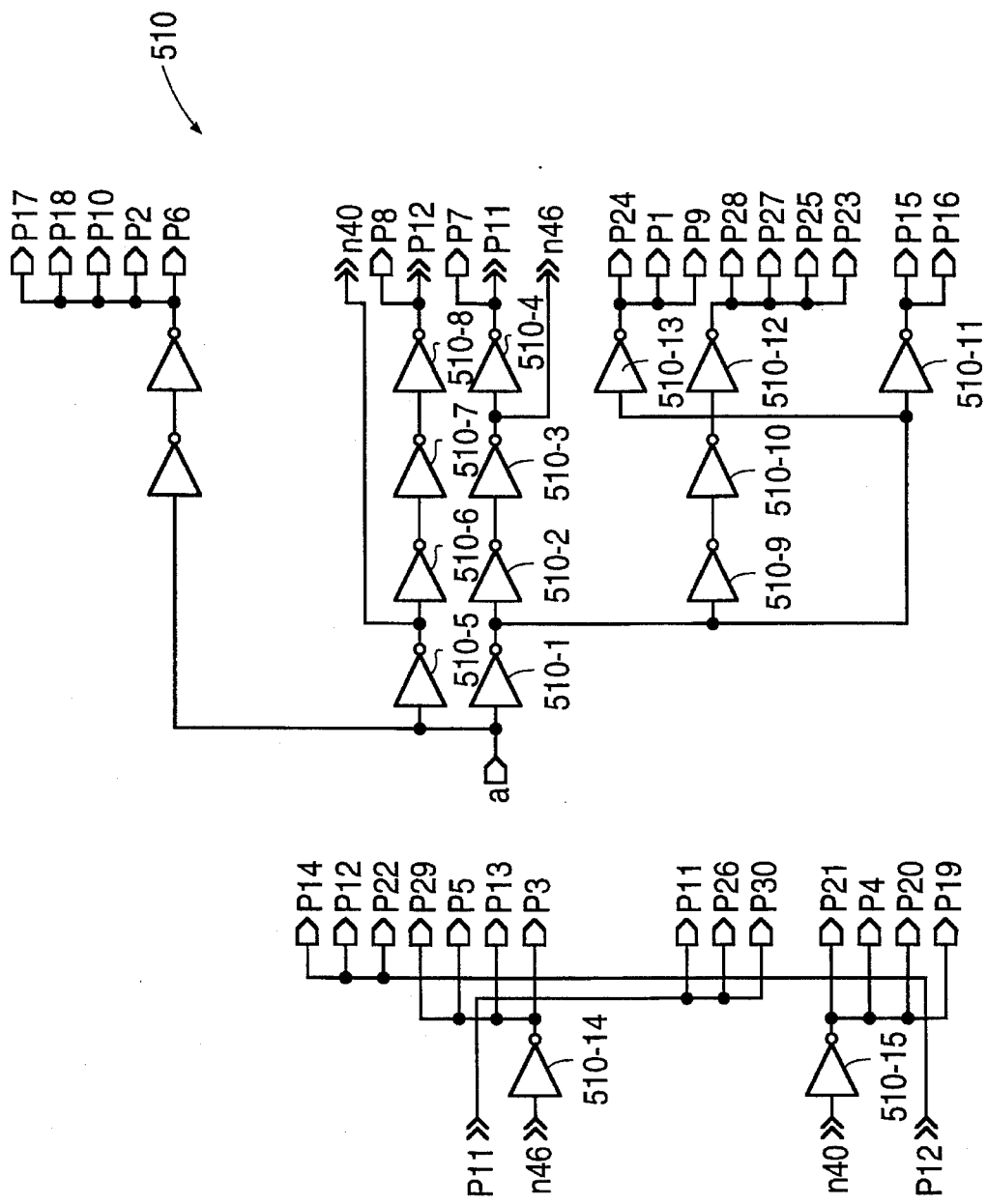
FIG. 11 is an example of one embodiment of a mapped and optimized logic network corresponding to the sample fanout logic network of FIG. 10.

Using the target library of TABLE 1 and the mapping and optimization method described above, unmapped NOR gate 430 (FIG. 10) with a fanout of thirty was mapped to logic network 510 (FIG. 11). The important aspect is that each of the unmapped logic networks generated in step 320-1 (FIG. 4) are mapped in step 320-2.

After the mapping and optimization, the actual time delay for signal propagation from the output terminal of unmapped logic node g to the input terminals of the driven unmapped logic nodes is determined using the mapped and optimized logic network and the time delay information provided with the target library of TABLE 1. Again, the method for determining the actual time delay of a mapped and optimized logic network is well known to those skilled in the art. Moreover, the method was described above in step 310-2 and that description is incorporated herein by reference.

At the end of step 320-2, a table is available containing (m–j+1) rows where each row includes an unmapped sample logic network fanout and the corresponding time delay for the mapped and optimized logic network for that fanout. Hence, information relating fanout for an unmapped logic node, i.e., one of the unmapped sample logic networks with a specified fanout, to a corresponding delay time for the mapped and optimized logic network is available. This information may be processed in numerous ways to generate a means for capturing the change in delay time in the mapped and optimized logic network with a change in fanout of the unmapped logic node. For example, a lookup table is generated in one embodiment. The lookup table is used in method step 120 (FIG. 2) and in simulator 220 (FIG. 3) to generate time delay $\tilde{t}_g^{fanout}$ in a manner equivalent to that described above for time delay $\tilde{t}_g^{fanin}$.

Figure 12:
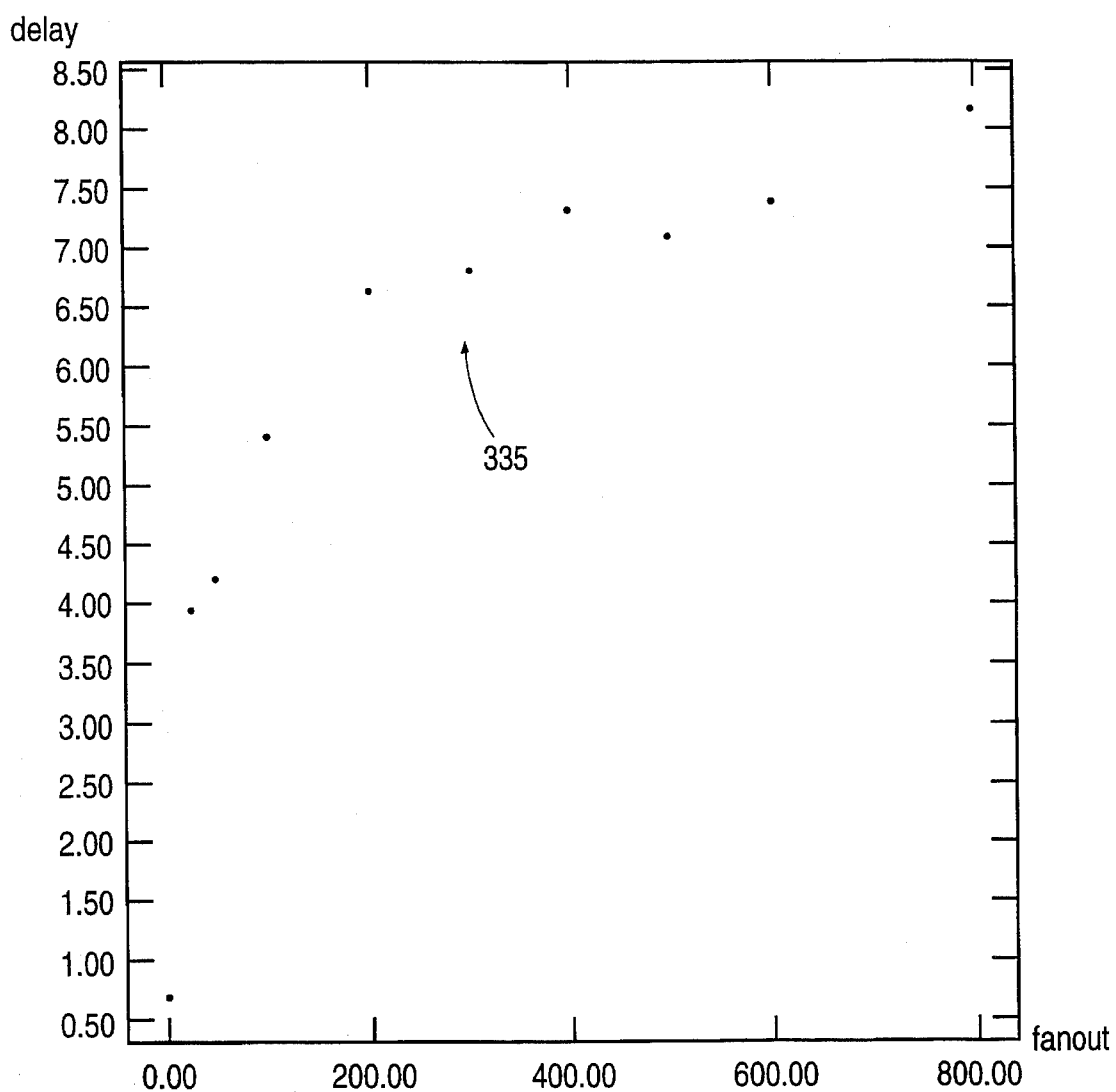
FIG. 12 is a linear plot of the fanout time delay data generated by the mapping and optimization of the sample circuits that span the fanout range selected by the user.

Preferably, the data from step 320-2 is used in generate curve step 320-3. Specifically, fanout is represented along a horizontal axis (FIG. 12) and time delay for the mapped and optimized logic network is represented along the vertical axis. Each row in the table from step 320-2 is plotted on this coordinate system so that data plot 335 is obtained. FIG. 12 illustrates the plotted data for the range of fanout from 2 through 00, described above, in step 320-2. The plotted data are the actual time delays in the mapped and optimized logic network associated with the unmapped logic network having the fanout given on the horizontal axis.

In select function step 320-4, a function $F_o$ is chosen that approximates the functional relationship depicted by data 335. In this embodiment, the function selection is empirical, but as described above for function $F_i$, the function selection may also utilize a user selected fitting method.

Preferably, the function is chosen from the group of functions consisting of constant, linear, quadratic, square root, and logarithmic. Typically, a single function is selected to cover the entire fanout range. However, the objective is to select a function that most closely approximates the plotted data. The function may be a combination of several functions if necessary. For example, the function may be a constant over a first portion of the fanout range and a linear function over the remainder of the fanout range.

Figure 13:
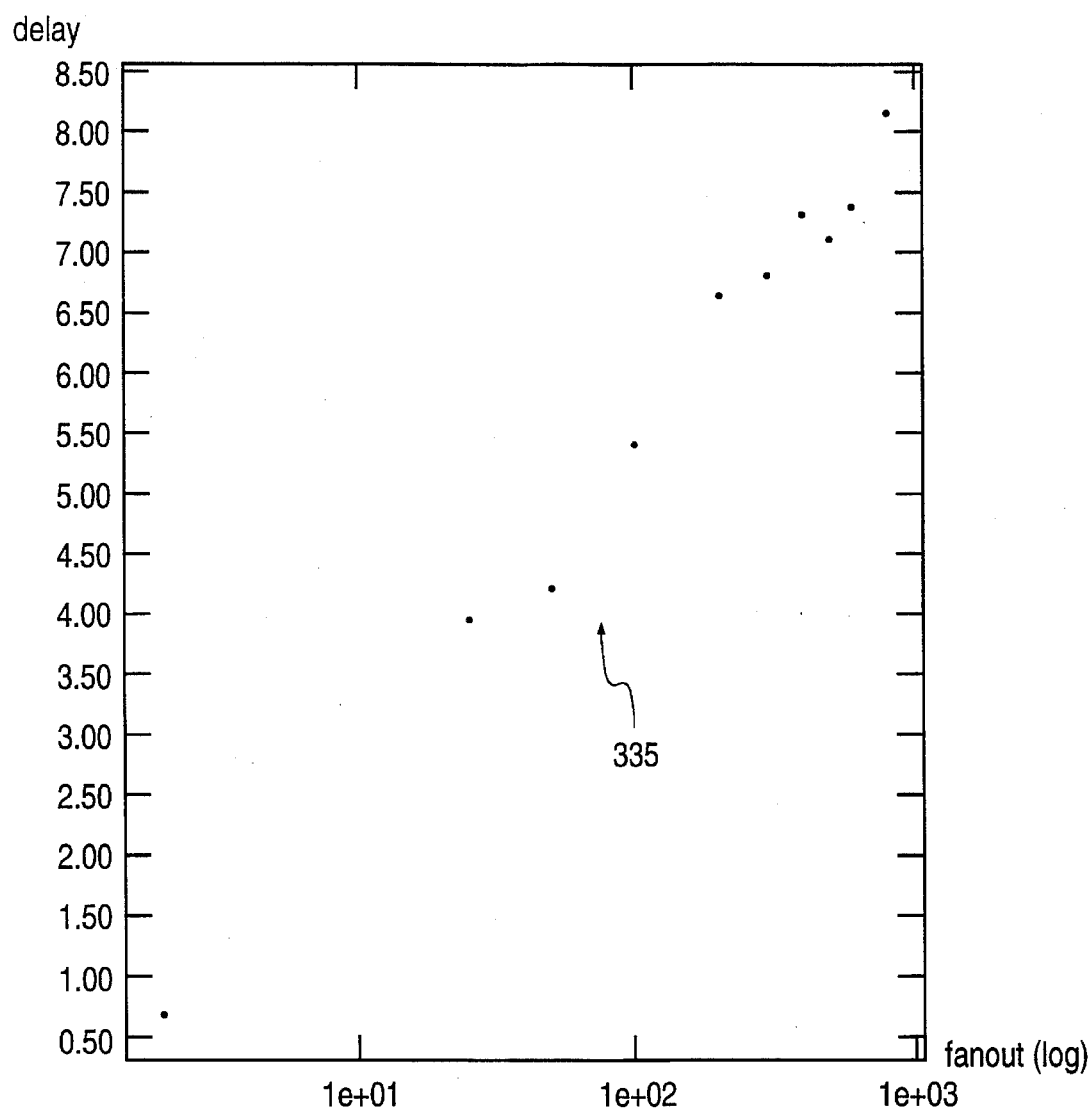
FIG. 13 is a semi-log plot of the fanout time delay data presented in FIG. 12.

Over the range of fanout in FIG. 12, a logarithmic function was selected. To verify that the functional relationship between the delay time and the fanout was approximately logarithmic, the data in FIG. 12 were replotted. The delay time was plotted on a vertical linear scale (FIG. 13) and the fanout was plotted on a horizontal logarithmic scale. The plotted data (FIG. 13) generally fell about a straight line. Thus, the selection of the function "log" for function $F_o$ approximates the function represented by the data in FIG. 12.

Function selection process 320-4 (FIG. 4), e.g., selection of log(O(g)) for this example, captures the functional change in delay time of the optimized and mapped logic network as the fanout in the unmapped logic network changes. However, a set of coefficients $C_o$ and a constant $D_o$ are required to capture the actual variations in delay time associated with the target technology. In most instances, the set of coefficients contains only a single member. Thus, in the following discussion, only one coefficient $C_o$ is described.

Figure 14A:
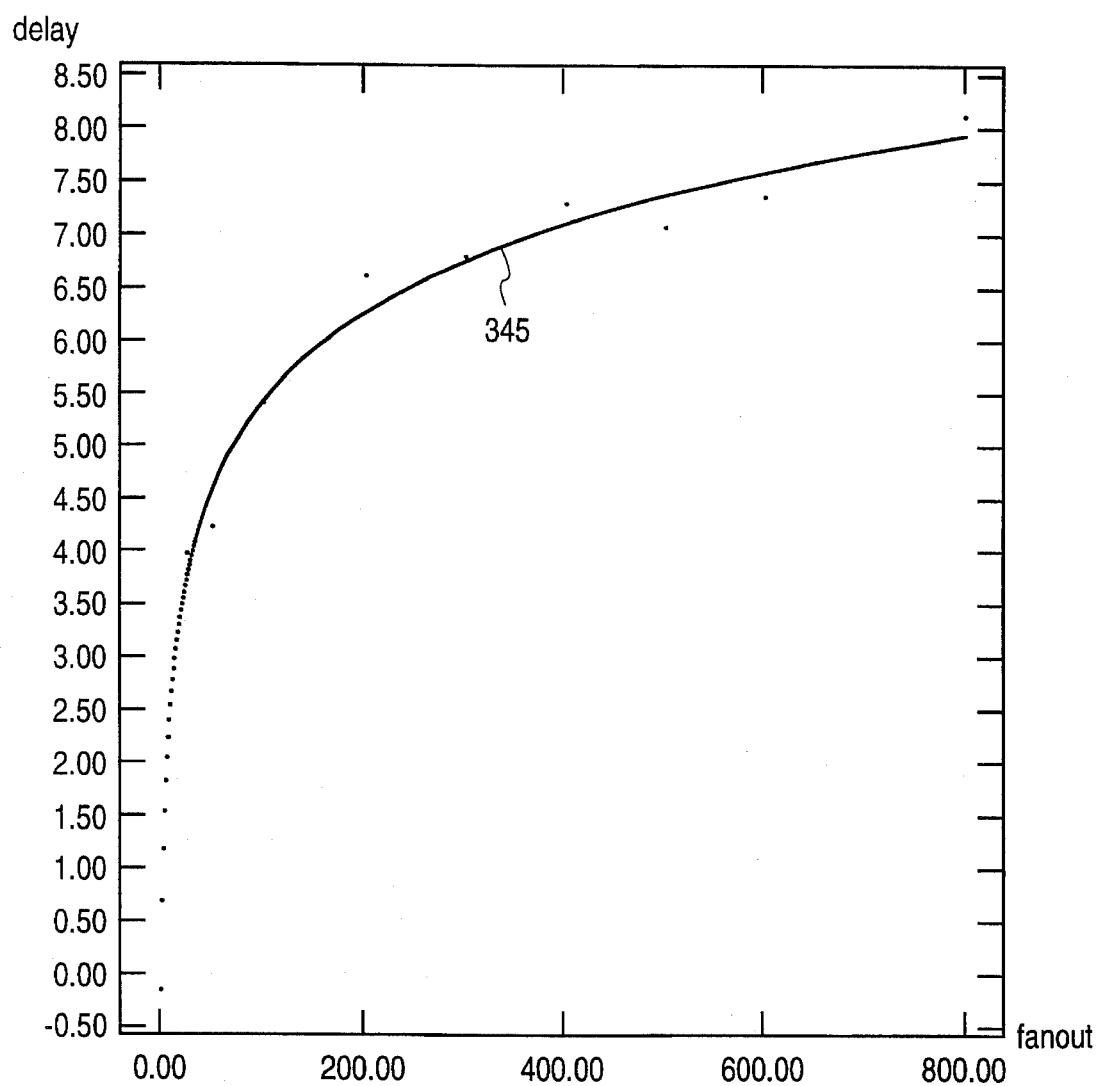
FIGS. 14A and 14B illustrate on a linear and semilog plot, respectively the fanout time delay generated using the fanout delay simulator of this invention.
Figure 14B:
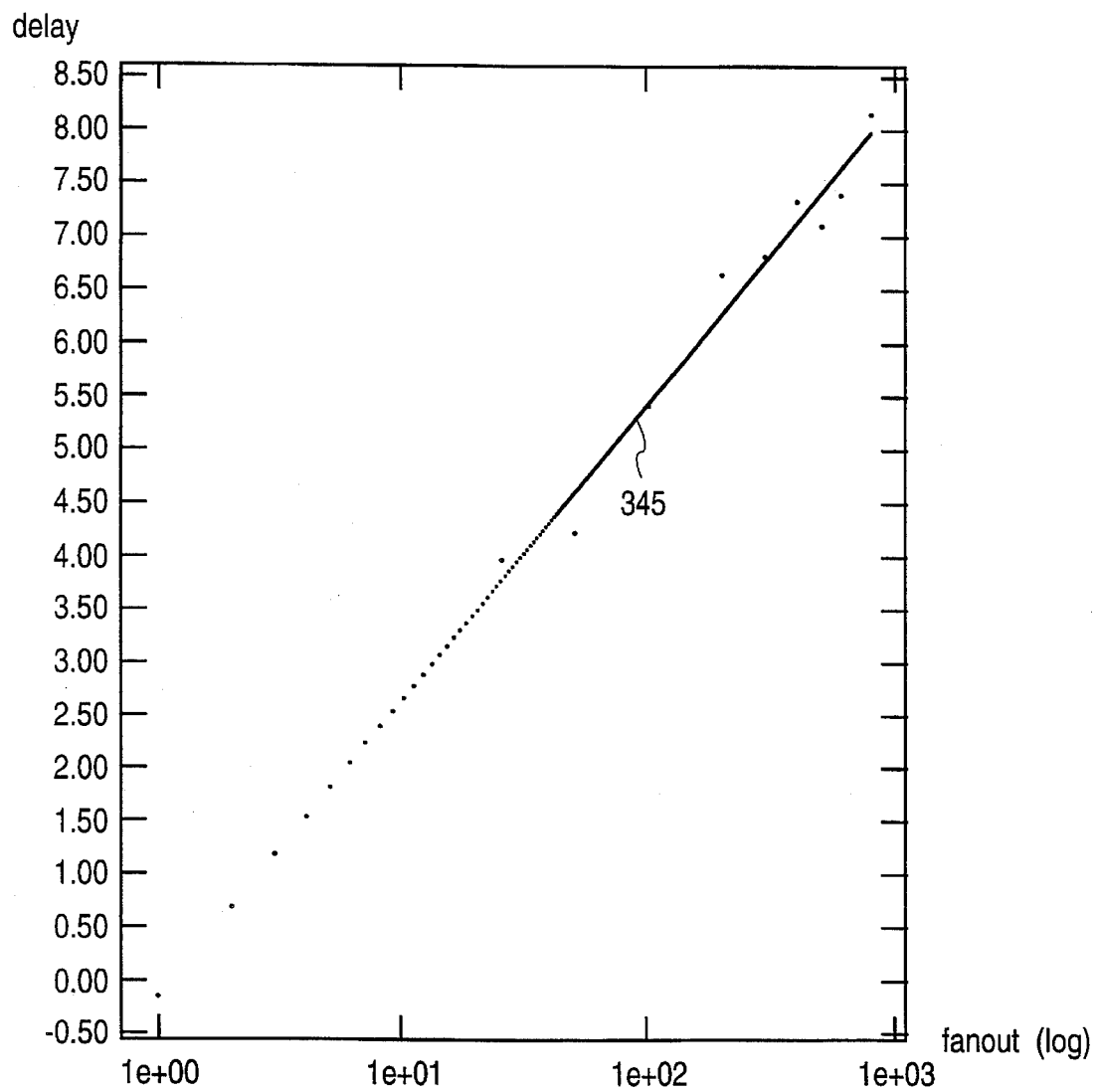

Coefficient $C_o$ and constant $D_o$ are generated in choose coefficients step 320-5 (FIG. 4). Procedures for fitting a function to a set of data points to determine coefficient $C_o$ and constant $D_o$ are well known, as described above. The fitting method used is typically selected to minimize the computer resources used in the fitting, in particular, the time required for the fitting. Selecting a fitting method that minimizes computer resource requirements facilitates use of the method and structure of this invention for a wide variety of target technologies and mapping and optimization methods. Using the minimum variance estimator described above for the data in FIG. 12, coefficient $C_o$ and constant $D_o$ were determined. A value of 0.85 for coefficient $C_o$ and a value of −0.14 for constant $D_o$ were obtained Relative value delay time $\tilde{t}_g^{fanout}$ using coefficient $C_o$, function $\log(O(g))$, and constant $D_o$ is illustrated as curve 345 in FIGS. 14A and 14B. The generation of coefficient $C_o$ and constant $D_o$ completes step 320.

As a result of step 320, fanout time delay simulator $\tilde{t}_g^{fanout}$ predicts the time delay in the mapped and optimized logic network using only the fanout associated with the unmapped logic node. The relative delay time produced by fanout time delay simulator includes not only the fanout delay time but also the intrinsic delay time associated with the fanout.

After step 320, processing transfers to assembly step 330. In assembly step 330, the means for generating the absolute value of the delay times for step 130 of method 100 (FIG. 2) and generator 230 of simulator 200 (FIG. 3) are completed.

Specifically, assembly step 330 (FIG. 4) combines and scales the output signal of the delay time simulators generated in steps 310 and 320. Specifically, relative delay time $\tilde{t}_g^{relative}$ in the mapped and optimized logic network associated with unmapped logic node g is:

$$\tilde{t}_g^{relative} = \tilde{t}_g^{fanout} + \tilde{t}_g^{fanin} \quad (3)$$

To obtain absolute value time delay $T_g^{delay}$ of the mapped and optimized logic network for unmapped logic node g, relative delay time $\tilde{t}_g^{relative}$ scaled by a scaling factor S, i.e., $$T_g^{delay} = S \tilde{t}_g^{relative} \quad (4)$$

Thus, step 330 not only combines the fanin and fanout time delay simulators, but also generates scaling factors. The three components of time delay $T_g^{delay}$ of step 130 and simulator 230 follow directly from the absolute value delay time $T_g^{delay}$ (Equation 4) and definition of relative delay time $\tilde{t}_g^{relative}$ (Equation 3)

$$T_g^{delay} = S(\tilde{t}_g^{fanin} \tilde{t}_g^{fanout}) \quad (5)$$

but fanin delay time simulator $\tilde{t}_g^{fanin}$ and fanout delay time simulator $\tilde{t}_g^{fanout}$ were constructed as described above and represented in equations (1) and (2) respectively. Hence, using the construction of the simulators in equation 5 gives:

$$T_g^{delay} = S(C_i F_i(I(g)) + C_o F_o(O(g)) + D_i + D_o)$$

$$T_g^{delay} = SC_i F_i(I(g)) + SC_o F_o(O(g)) + S(D_i + D_o) \quad (6)$$

$$T_g^{delay} = \text{fanin delay} + \text{fanout delay} + \text{intrinsic delay}$$

$$T_g^{delay} = T_g^{fanin} + T_g^{fanout} + T_g^{intrinsic}$$

Thus, assembly step 330 generates not only the absolute value of total time delay $T_g^{delay}$ but also absolute values of fanin time delay $T_g^{fanin}$, fanout time delay $T_g^{fanout}$ and intrinsic time delay $T_g^{intrinsic}$ of the mapped and optimized logic network corresponding to unmapped logic node g.

Scaling factor S, as described above, transforms the relative value time delays to absolute value time delays. In one embodiment, scaling factor S is a constant. Specifically, a sample logic network is selected and then mapped and optimized using the target library. The actual delay time $T_{sample}^{actual}$ of the resulting mapped and optimized logic network is ascertained using the time delay parameters in the target library and the method described above in step 310-2. Estimated total relative delay time $\tilde{t}_{sample}^{relative}$ is generated by summing the relative time delay $\tilde{t}_g^{relative}$, as described above, for each logic node in the selected sample unmapped logic network. Scaling factor S is defined as $$S = T_{sample}^{actual} / \tilde{t}_{sample}^{relative} \quad (7)$$

In one embodiment, the selected unmapped logic network was:

$$O = abcd + efgh + ijkl + mnop \quad (8)$$

i.e. an A04444 gate where $a, b, \ldots, p$ are input signals. Time delay $T_{sample}^{actual}$ for the mapped and optimized circuit was 2.91. Relative time delay estimate $\tilde{t}_{sample}^{relative}$ was 5.39 where the relative delay estimate was obtained using the results for delay time simulators $\tilde{t}_g^{fanin}$ and $\tilde{t}_g^{fanout}$ described above. Thus, in this embodiment, scaling factor S was 0.54. With this value of S, the scaled delay time simulators are:

$$T_g^{fanin} = S \tilde{t}_g^{fanin} = 0.50 \log(I(g)) + 0.2538$$

$$T_g^{fanout} = S \tilde{t}_g^{fanout} = 0.46 \log(O(g)) - 0.0756$$

$$T_g^{delay} = 0.50 \log(I(g)) + 0.46 \log(O)g)) + 0.18$$

$$T_g^{fanin} = 0.5 \log(I(g))$$

$$T_g^{fanout} = 0.46 \log(O(g))$$

$$T_g^{intrinsic} = 0.18$$

In assembly step 330, for structure 200, the four absolute value time delay simulators are entered in structure 230 for automated delay time simulation by describing the simulators in a computer program language such as the "C" programming language that is well known to those skilled in the art. One embodiment of such a structure in presented in Microfiche Appendix A, which is a part of the present disclosure and incorporated herein by reference in its entirety.

The computer program in Microfiche Appendix A was compiled and linked, in one embodiment, using the UNIX operating system SUN OS 4.0.3, the compiler, and the linker that are provided with a workstation such as the SUN-4 computer system available from Sun Microsystems of Palo Alto, Calif. The particular computer language and the computer system used are not an essential aspect of this invention. In view of this disclosure, those skilled in the art can implement the invention using a different computer language and/or a different computer system.

Method 100 and structure 200, which are the result of process 300, are typically used to predict time delays, identify critical sections of an unmapped logic network from a speed standpoint, and direct the optimization process of unmapped logic networks. Unlike the prior art methods that gave only relative time estimates, method 100 and structure 200 provide absolute time delays that include fanin, fanout and intrinsic time delays in the mapped and optimized logic network formed using the target library. Thus, the user can make educated accurate decisions about the optimization process without mapping and optimizing the unmapped logic network to ascertain the absolute time delays. Consequently, method 100 and structure 200 greatly enhance the optimization process by diminishing the demand on user and computer resources without comprising the quality of the final results.

Since method 100 and structure 200 require determination of new functions and constants for each target technology and each mapping and optimization method, several alternatives have been investigated for enhancing process 300. As mentioned above, if the fanin and fanout ranges are limited, the number of processing steps is diminished. Hence, in one embodiment the number of points in the fanin and fanout range used in process 300 is limited to an empirically determined set of points.

For example, a set as small as three data points has been successfully used to generate method 100 and structure 200 of this invention. Specifically, sample logic networks having fanins of 1, 10 and 40 and fanouts of 1, 10 and 40 were selected. Process 300, as described above, was used to generate the time delay simulators for method 100 and structure 200. The resulting delay time simulators performed satisfactorily.

To illustrate the advantages of method 100 (FIG. 2) and simulator 200 (FIG. 3) of this invention, a set of unmapped logic networks were selected. Specifically, thirty circuits were selected from the International Workshop on Logic Synthesis, 1989, Benchmark Set, which was put together by the program committee as standard circuits for comparing different synthesis and optimization algorithms. The circuits used are designated in that benchmark set as:

| 5xp1 | 9sym | 9symm1 | C1355 | C1908 |
|---|---|---|---|---|
| C3540 | C432 | C499 | C7552 | C880 |
| alu2 | alu4 | cm150a | cm151a | cm152a |
| cm162a | cm163a | cm42a | cm82a | cm85a |
| cmb | comp | con1 | count | cu |
| decod | des | misex1 | misex2 | misex3 |

Figure 15:
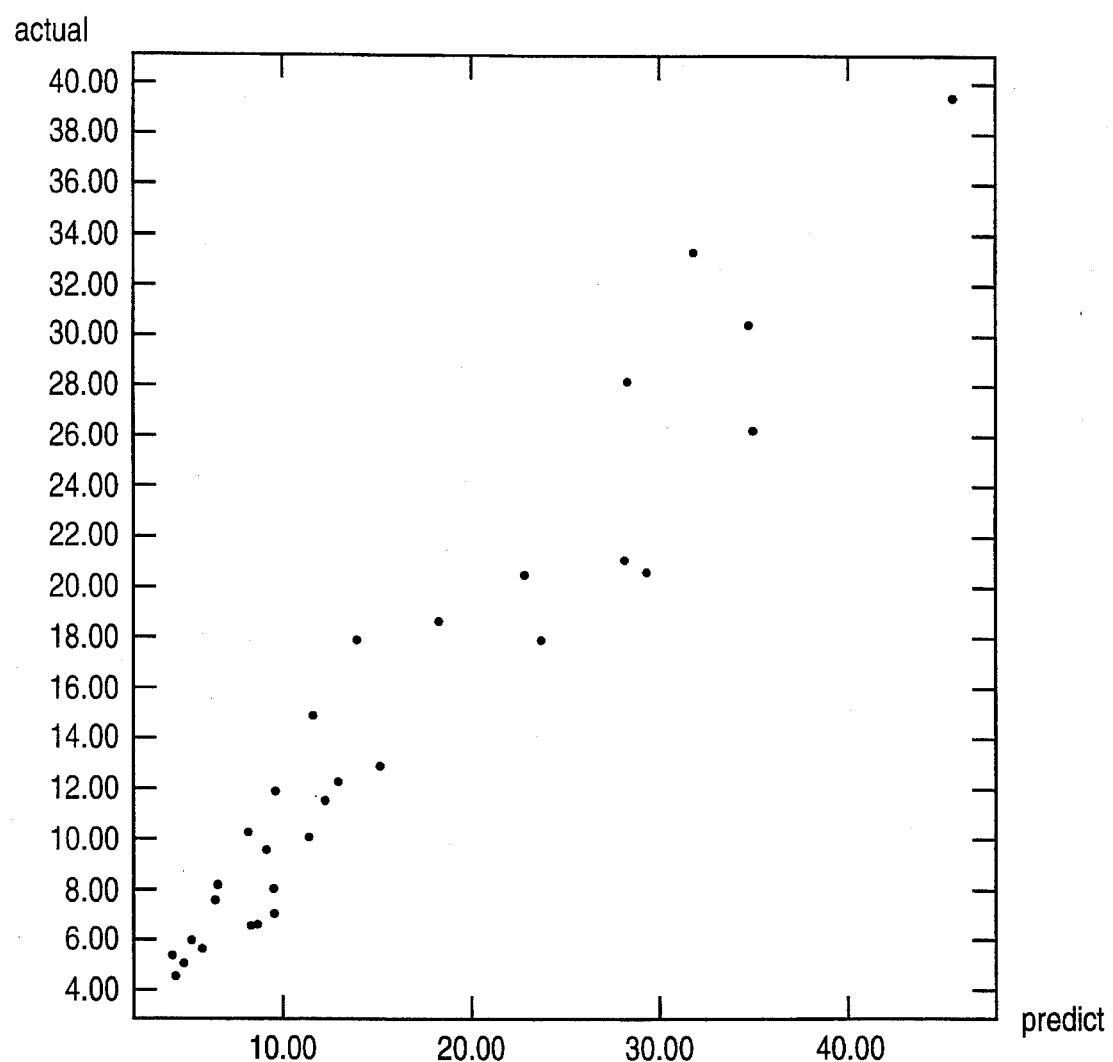
FIG. 15 is a plot of the actual time delay vs. the absolute value of the time delay generated by the delay time simulator of this invention for 30 different circuits.

Simulator 200 was used for each of the 30 unmapped logic networks to obtain simulated total time delay for each of the 30 circuits. Also, each of the 30 circuits was mapped and optimized using the target library given in TABLE 1. The actual time delay for each mapped and optimized circuit was determined using the set of time parameters in the target library. FIG. 15 illustrates the correlation between the actual time delays and the simulated time delays according to the principles of this invention. Each data point in FIG. 15 corresponds to one of the 30 circuits. The value of the point on the X axis is the simulated time delay and the value on the Y axis is the actual time delay.

Figure 16:
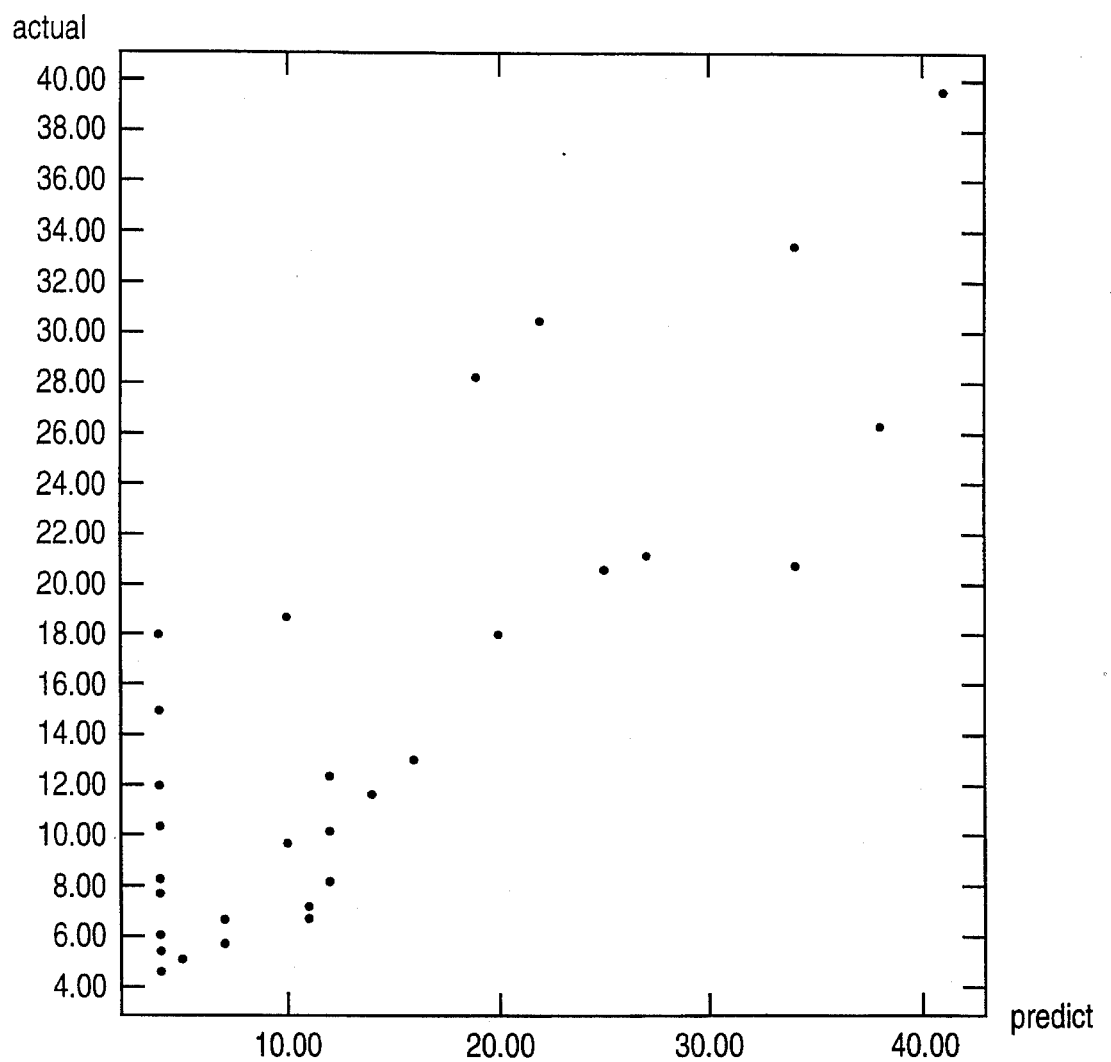
FIG. 16 is a plot of the actual time delay vs. the time delay generated by the prior art level model for the same 30 different circuits as in FIG. 15.

In addition to simulator 200 of this invention, the delay time for each of the 30 circuits was estimated using the level model described above. FIG. 16 is a plot similar to that of FIG. 15 except the simulated time delay values are those obtained using the level model. Also, the modified-level model, as described above, was used to simulate the time delay for each of the 30 circuits. The results are presented in FIG. 17.

Figure 17:
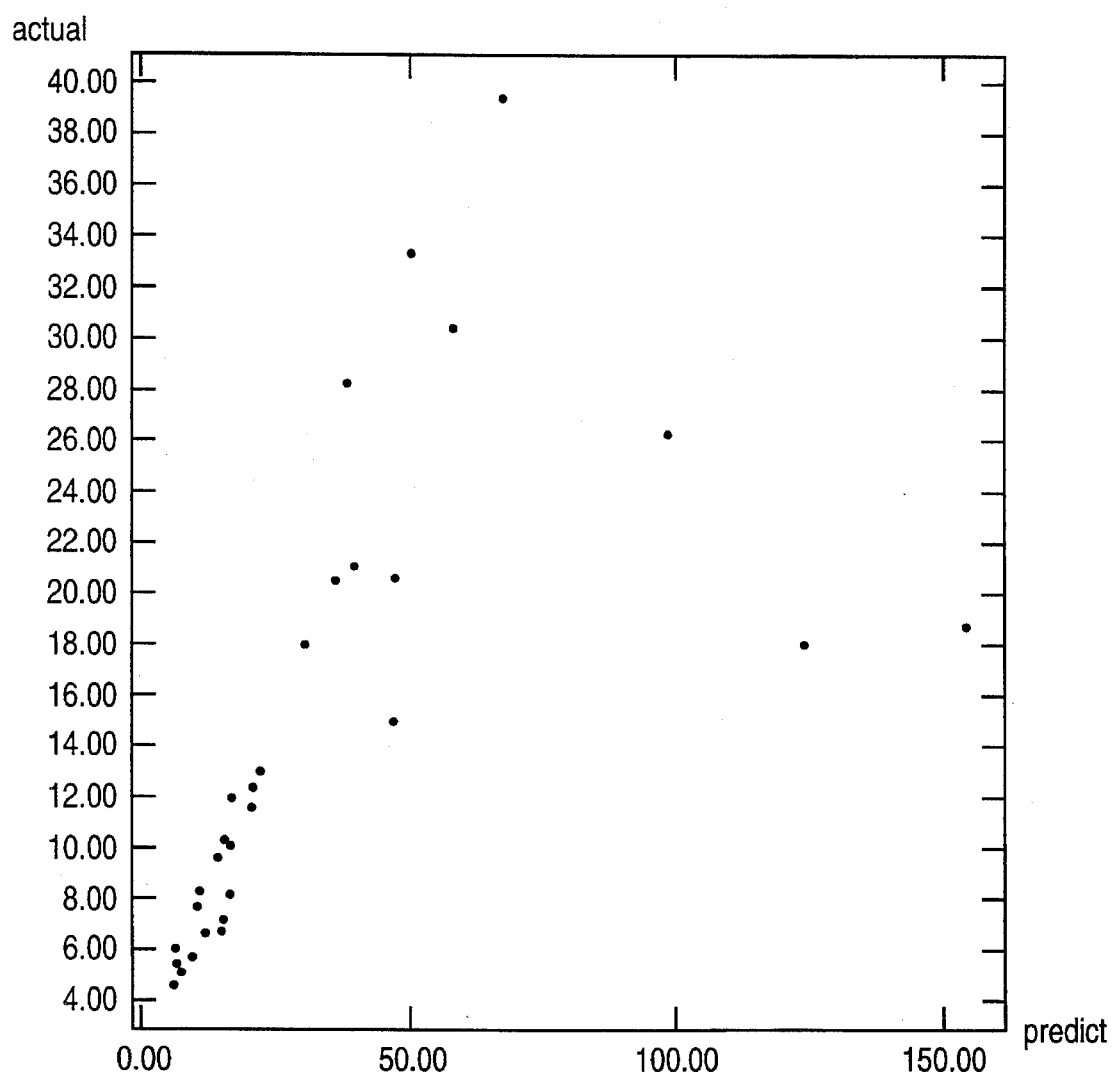
FIG. 17 is a plot of the actual time delay vs. the time delay generated by the prior art modified level model for the same 30 different circuits as in FIG. 15.

As shown in FIG. 16 and FIG. 17, the modified level model and the level model both fail to reliably simulate the actual delay times. However, as shown in FIG. 15, the estimates produced according to the principles of this invention are clustered about a 45-degree angle diagonal line. Therefore, the simulated values are reliable predictors of the actual time delays.

One embodiment of the methods and structures of this invention has been presented. This embodiment is illustrative of the principles of the invention and is not intended to limit the scope of the invention to the particular embodiment given. In view of this disclosure, those skilled in the art will be able to implement other delay time estimators using the principles of this invention. For example, a first set of delay time simulators can be constructed using one representative function and a second set of delay time simulators can be constructed using a different representative function. Both sets of delay time simulators would be used to process the logic nodes in the unmapped logic network and the simulated delay time would be the combination of the output signals from the two sets of delay time simulators.

I claim:

1. A computer implemented process for generating a time delay simulator that uses a characteristic of a logic node in an unmapped logic network to a delay time in mapped and optimized logic network in a specified target technology, said mapped and optimized logic network corresponding to said logic node in said unapped logic network, wherein the characteristic is represented by a value, said process comprising the steps of:

(a) selecting a target technology having a library of standard gates;

(b) selecting a mapping and optimization method;

(c) selecting a representative logic function;

(d) generating a multiplicity of sample unmapped logic having a selected range of values of said characteristic using said representative logic function;

(e) mapping and optimizing each of said sample logic nodes for speed using said library of standard gates with said mapping and optimization method thereby producing a multiplicity of mapped and optimized sample logic networks;

(f) determining delay time for each of said multiplicity of mapped and optimized sample logic networks thereby generating data including the delay time in said mapped and optimized sample logic network for each value of said characteristic chosen in step (d); and (g) using said data to generate a means for simulating a delay time associated with the mapped logic network corresponding to said logic node in said unmapped logic network, given the value of said characteristic of said logic node, wherein said means for simulating is the time delay simulator and does not require generation of a mapped and optimized logic network to simulate said delay time.

2. The process of claim 1 wherein said characteristic is fanout.

3. The process of claim 1 wherein said characteristic is fanin.

4. The process of claim 3 wherein steps (d) through (g) are repeated with said characteristic being changed from said fanin to fanout thereby generating both a fanin time delay simulator and a fanout time delay simulator.

5. The process of claim 4 further comprising the step of:

combining the fanin time delay simulator and the fanout time delay simulator to obtain a total time delay simulator.

6. A computer process for simulating delay times in a mapped and optimized logic network in a target technology for a logic node in an unmapped logic network, comprising the steps of:

determining a fanin of said logic node in said unmapped logic network;

converting said fanin of said logic node in said unmapped logic network to a first time delay in said mapped and optimized logic network, without generating said mapped and optimized logic network, to thereby generate a simulated first time delay; and determining a fanout of said logic node in said unmapped logic network;

converting said fanout of said logic node in said unmapped logic network to a second time delay in said mapped and optimized logic network, without generating said mapped and optimized logic network, to thereby generate a simulated second time delay.

7. The computer process of claim 6 further comprising the step of:

combining said simulated first and second time delays thereby simulating a fanin time delay, a fanout time delay and an intrinsic time delay for said mapped and optimized logic network in said target technology to thereby generate a simulated fanin time delay, a simulated fanout time delay and a simulated intrinsic time delay.

8. The computer process of claim 7 further comprising the step of:

scaling said simulated fanin time delay, said simulated fanout time delay and said simulated intrinsic time delay for said mapped and optimized logic network thereby obtaining simulated absolute time delays.

9. The computer process of claim 6 further comprising the step of:

accumulating the simulated first time delay for each of a plurality of individual logical nodes in the unmapped logic network to thereby generate a simulated cumulative first time delay for a mapped and optimized logic network in the target technology, corresponding to said plurality of individual mapped nodes in the unmapped logic network.

10. The computer process of claim 9 further comprising the step of:

accumulating the simulated second time delay for each of a plurality of individual logic nodes in the unmapped logic network to thereby generate a simulated cumulative second time delay for a mapped and optimized logic network in the target technology, corresponding to said plurality of individual mapped nodes in the unmapped logic network.

11. The computer process of claim 10 further comprising the step of:

combining said first and second simulated cumulative time delays thereby generating a simulated fanin time delay, a simulated fanout time delay and a simulated intrinsic time delay for said mapped and optimized logic network in said target technology.

12. The computer process of claim 11 further comprising the step of:

scaling said simulated fanin, fanout and intrinsic time delays for said mapped and optimized logic network thereby obtaining simulated absolute time delays.

13. The method of claim 6 wherein the logic node in the unmapped logic network has a fanin N and further wherein said step of converting said fanin of said logic node in said unmapped logic network to said first time delay includes the steps of:

evaluating a predetermined function $F_i$ at said fanin N to obtain a value $F_i(N)$ wherein said predetermined function Fi simulates a delay time change in said mapped and optimized logic network in said target technology with a change in fanin of said unmapped logic node;

multiplying said value $F_i(N)$ by a predetermined constant $C_i$ to obtain a product $C_i F_i(N)$; and adding a predetermined constant $D_i$ to said product $C_i F_i(N)$ thereby generating said simulated first time delay in said mapped and optimized logic network in said target technology for said unmapped logic node having said fanin N.

14. The method of claim 6 wherein the logic node in the unmapped logic network has a fanout N and further wherein said step of converting said fanout of said logic node in said unmapped logic network to said second time delay includes the steps of:

evaluating a predetermined function $F_o$ at said fanout N to obtain a value $F_o(N)$ wherein said predetermined function $F_o$ simulates a delay time change in said mapped and optimized logic network in said target technology with a change in fanout of said unmapped logic node;

multiplying said value $F_o(N)$ by a predetermined constant $C_o$ to obtain a product $C_o F_o(N)$; and adding a predetermined constant $D_o$ to said product $C_o F_o(N)$ thereby generating said simulated second time delay in said mapped and optimized logic network in said target technology for said unmapped logic node having said fanout N.

15. In a computer, a simulator for generating delay times in a mapped and optimized logic network in a target technology, said mapped and optimized logic network corresponding an unmapped logic network comprising:

means, operatively coupled to said unmapped logic network, for converting a fanin or a logic node in said unmapped logic network to a first time delay in said mapped and optimized logic network, without generating said mapped and optimized logic network, to thereby generate a simulated first time delay; and means, operatively coupled to said unmapped logic network, or converting a fanout or said logic node in said unmapped logic network to a second time delay in said mapped and optimized logic network, without generating said mapped and optimized logic network, to thereby generate a simulated second time delay.

16. In a computer, the simulator of claim 15 further comprising:

means, operatively coupled to both of said converting means, for combining said simulated first and second time delays thereby simulating a fanin time delay, a fanout time delay and an intrinsic time delay for said mapped and optimized logic network in said target technology no thereby generate a simulated fanin time delay, a simulated fanout time delay, and a simulated intrinsic time delay.

17. In a computer, the simulator of claim 16 further comprising:

means, operatively coupled to said combining means, for scaling said simulated fanin time delay, said simulated fanout time delay and said simulated intrinsic time delay for said mapped and optimized logic network thereby obtaining simulated absolute time delays.

18. In a computer, the simulator of claim 15 further comprising:

means, operatively coupled to said fanin converting means, for accumulating the simulated first time delay for each of a plurality of individual logical nodes in unmapped logic network to thereby generate a simulated cumulative first time delay time for a mapped and optimized logic network in the target technology, corresponding to said plurality of individual nodes in the unmapped logic network.

19. In a computer, the simulator of claim 18 is wherein said accumulating means further comprises:

means, operatively coupled to said fanout converting means, for accumulating the simulated second time delay for each of a plurality of individual logical nodes in the unmapped logic network to thereby generate a cumulative second time delay time for a mapped and optimized logic network in the target technology, corresponding to said plurality of individual nodes in the unmapped logic network.

20. In a computer, the simulator of claim 19 further comprising:

means, operatively coupled to said accumulating means, for combining said first and second simulated cumulative time delays thereby generating a simulated fanin time delay, a simulated fanout time delay and a simulated intrinsic time delay for said mapped and optimized logic network in said target technology.

21. In a computer, the simulator of claim 20 wherein said combining means further comprises:

means for scaling said simulated fanin, fanout and intrinsic time delays for said mapped and optimized logic network thereby obtaining simulated absolute time delays.

* * * * *

UNITED STATES PATENT AND TRADEMARK OFFICE
CERTIFICATE OF CORRECTION

PATENT NO. : 5,500,808
DATED : March 19, 1996
INVENTOR : Albert R. Wang

It is certified that error appears in the above-identified patent and that said Letters Patent is hereby corrected as shown below:

Column 16, line 47

Delete " $\tilde{t}_g fanout = C_o F_o (O(f)) + D_o$ " and insert

" $-- \tilde{t}_g fanout = C_o F_o (O(g)) + D_o --$ "

Column 20, lines 9, 24
Delete " $T_{sample}^{actual}$ " and insert

" $-- T_{sample}^{actual} --$ "

Column 20, lines 12, 25

Delete " $\tilde{t}\ sample^{relative}$ " and insert

" $-- \tilde{t}_{sample}^{relative} --$ "

Signed and Sealed this

Twentieth Day of May, 1997

Attest:

BRUCE LEHMAN

*Attesting Officer*    *Commissioner of Patents and Trademarks*